(12) United States Patent
Motoyama et al.

(10) Patent No.: US 12,366,685 B2
(45) Date of Patent: Jul. 22, 2025

(54) LIGHT EMITTING ELEMENT, DISPLAY DEVICE, AND METHOD FOR MANUFACTURING DISPLAY DEVICE

(71) Applicant: Sony Semiconductor Solutions Corporation, Kanagawa (JP)

(72) Inventors: Yosuke Motoyama, Kanagawa (JP); Reo Asaki, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 525 days.

(21) Appl. No.: 17/801,209

(22) PCT Filed: Jan. 25, 2021

(86) PCT No.: PCT/JP2021/002357
§ 371 (c)(1),
(2) Date: Aug. 19, 2022

(87) PCT Pub. No.: WO2021/171857
PCT Pub. Date: Sep. 2, 2021

(65) Prior Publication Data
US 2023/0097317 A1    Mar. 30, 2023

(30) Foreign Application Priority Data
Feb. 26, 2020    (JP) ................. 2020-030250

(51) Int. Cl.
*H10K 50/858*    (2023.01)
*G02B 3/00*    (2006.01)
(Continued)

(52) U.S. Cl.
CPC ......... *G02B 3/0062* (2013.01); *H10K 50/858* (2023.02); *H10K 59/38* (2023.02);
(Continued)

(58) Field of Classification Search
None
See application file for complete search history.

(56) References Cited

U.S. PATENT DOCUMENTS

2010/0308359 A1* 12/2010 Singh ............... H10H 20/819
257/E33.074
2016/0087018 A1    3/2016 Shim
(Continued)

FOREIGN PATENT DOCUMENTS

CN    106816454 A  *  6/2017 ........... H01L 27/322
CN    116364835 A  *  6/2023
(Continued)

OTHER PUBLICATIONS

International Search Report (PCT/ISA/210), International Application No. PCT/JP2021/002357, dated Mar. 16, 2021.

*Primary Examiner* — Michael Lebentritt
(74) *Attorney, Agent, or Firm* — Michael Best & Friedrich LLP

(57) ABSTRACT

A light emitting element of the present disclosure includes a first substrate 41 and a second substrate 42, a light emitting unit 30 provided above the first substrate 41, a first microlens 51 formed above the light emitting unit 30 and having a convex shape toward the second substrate 42, a second microlens 52 provided on the second substrate 42 and having a convex shape toward the first microlens 51, and a bonding member 35 interposed between the first microlens 51 and the second microlens 52.

14 Claims, 27 Drawing Sheets

(51) Int. Cl.
  *H10K 59/38*   (2023.01)
  *H10K 59/80*   (2023.01)
  *H10K 71/00*   (2023.01)

(52) U.S. Cl.
  CPC ........... *H10K 59/879* (2023.02); *H10K 71/00* (2023.02); *H10K 59/876* (2023.02)

(56) References Cited

U.S. PATENT DOCUMENTS

2016/0178913 A1\* 6/2016 Endoh .................. G03F 7/0005
                                                                     359/627
2016/0380238 A1    12/2016 Ma
2024/0357909 A1\* 10/2024 Sano ..................... H05B 33/02

FOREIGN PATENT DOCUMENTS

| CN | 117930520 | A | \* | 4/2024 | |
|----|----|----|----|----|----|
| JP | 2001265240 | A | | 9/2001 | |
| JP | 2002124373 | | | 4/2002 | |
| JP | 2003330006 | A | | 11/2003 | |
| JP | 2005275142 | A | | 10/2005 | |
| JP | 2008177109 | A | | 7/2008 | |
| JP | 2009218341 | A | | 9/2009 | |
| JP | 2019128493 | A | | 8/2019 | |
| JP | 2019133816 | A | | 8/2019 | |
| JP | 7462890 | B2 | \* | 4/2024 | ........... A61B 3/0008 |
| KR | 20060129449 | A | | 12/2006 | |
| KR | 20160034458 | A | | 3/2016 | |
| WO | 2018135189 | A1 | | 7/2018 | |
| WO | WO-2020080022 | A1 | \* | 4/2020 | ........... G02B 3/0056 |
| WO | WO-2021171857 | A1 | \* | 9/2021 | ........... G02B 3/0062 |

\* cited by examiner

LIGHT EMITTING ELEMENT, DISPLAY DEVICE, AND METHOD FOR MANUFACTURING DISPLAY DEVICE

TECHNICAL FIELD

The present disclosure relates to a light emitting element, a display device, and a method for manufacturing a display device.

BACKGROUND ART

In recent years, display devices (organic EL display) using an organic Electroluminescence (EL) element as a light emitting element have been developed. In these display devices, for example, an organic layer including at least a light emitting layer and a second electrode (upper electrode, for example, cathode electrode) are formed on a first electrode (lower electrode, for example, anode electrode) formed separately for each pixel. Then, for example, each of a red light emitting element in which an organic layer that emits white light or red light and a red color filter layer are combined, a green light emitting element in which an organic layer that emits white light or green light and a green color filter layer are combined, and a blue light emitting element in which an organic layer that emits white light or blue light and a blue color filter layer are combined are provided as a sub-pixel, and these sub-pixels configure one pixel. The light from the light emitting layer is emitted to the outside through the second electrode (upper electrode). Then, in order to improve light extraction efficiency, a structure in which microlenses are provided, for example, a structure in which two microlenses are provided above and below each other is known from, for example, Japanese Patent Application Laid-Open No. 2008-177109. Furthermore, an organic light emitting element having a convex lens shape at a portion to be a light emitting unit of a transparent substrate is known from Japanese Patent Application Laid-Open No. 2002-124373.

CITATION LIST

Patent Document

Patent Document 1: Japanese Patent Application Laid-Open No. 2008-177109
Patent Document 2: Japanese Patent Application Laid-Open No. 2002-124373

SUMMARY OF THE INVENTION

Problems to be Solved by the Invention

As described above, by providing the two microlenses above and below each other, utilization efficiency of the light emitted from the organic EL light emitting element can be enhanced. However, it is extremely difficult to incorporate the two upper and lower microlenses disclosed in Japanese Patent Application Laid-Open No. 2008-177109 into an organic EL element, and it is also difficult to manufacture an organic light emitting element having the two upper and lower microlenses disclosed in FIG. 5 of Japanese Patent Application Laid-Open No. 2002-124373.

Therefore, an object of the present disclosure is to provide a light emitting element that can improve front light extraction efficiency and does not significantly increase the number of manufacturing steps, a display device including the light emitting element, and a method for manufacturing the display device.

Solutions to Problems

A light emitting element of the present disclosure for achieving the object described above includes:
a first substrate and a second substrate;
a light emitting unit provided above the first substrate;
a first microlens formed above the light emitting unit and having a convex shape toward the second substrate;
a second microlens provided on the second substrate and having a convex shape toward the first microlens; and
a bonding member interposed between the first microlens and the second microlens.

A display device of the present disclosure for achieving the object described above includes:
a first substrate and a second substrate; and
a plurality of light emitting element units each including a first light emitting element, a second light emitting element, and a third light emitting element provided on the first substrate,
in which each light emitting element includes a light emitting unit provided above the first substrate,
a first microlens formed above the light emitting unit and having a convex shape toward the second substrate,
a second microlens provided on the second substrate and having a convex shape toward the first microlens, and
a bonding member interposed between the first microlens and the second microlens.

A method for manufacturing a display device of the present disclosure for achieving the object described above, includes each step of:
preparing a first substrate above which a plurality of light emitting units and a plurality of first microlenses formed above the light emitting units and having a convex shape in a direction away from the first substrate are provided;
preparing a second substrate including a second microlens having a convex shape in a direction away from the second substrate;
forming a bonding member on a surface of the first substrate on which the first microlens is provided, a surface of the second substrate on which the second microlens is provided, or a surface of the first substrate on which the first microlens is provided and a surface of the second substrate on which the second microlens is provided;
disposing the first substrate and the second substrate such that the first microlens and the second microlens face each other with the bonding member interposed therebetween;
forming a flat portion by bringing a top surface of the first microlens into contact with a top surface of the second microlens by applying pressure to the first substrate and the second substrate; and
bonding the first microlens and the second microlens by the bonding member after aligning the first substrate and the second substrate.

MODE FOR CARRYING OUT THE INVENTION

Figure 1:
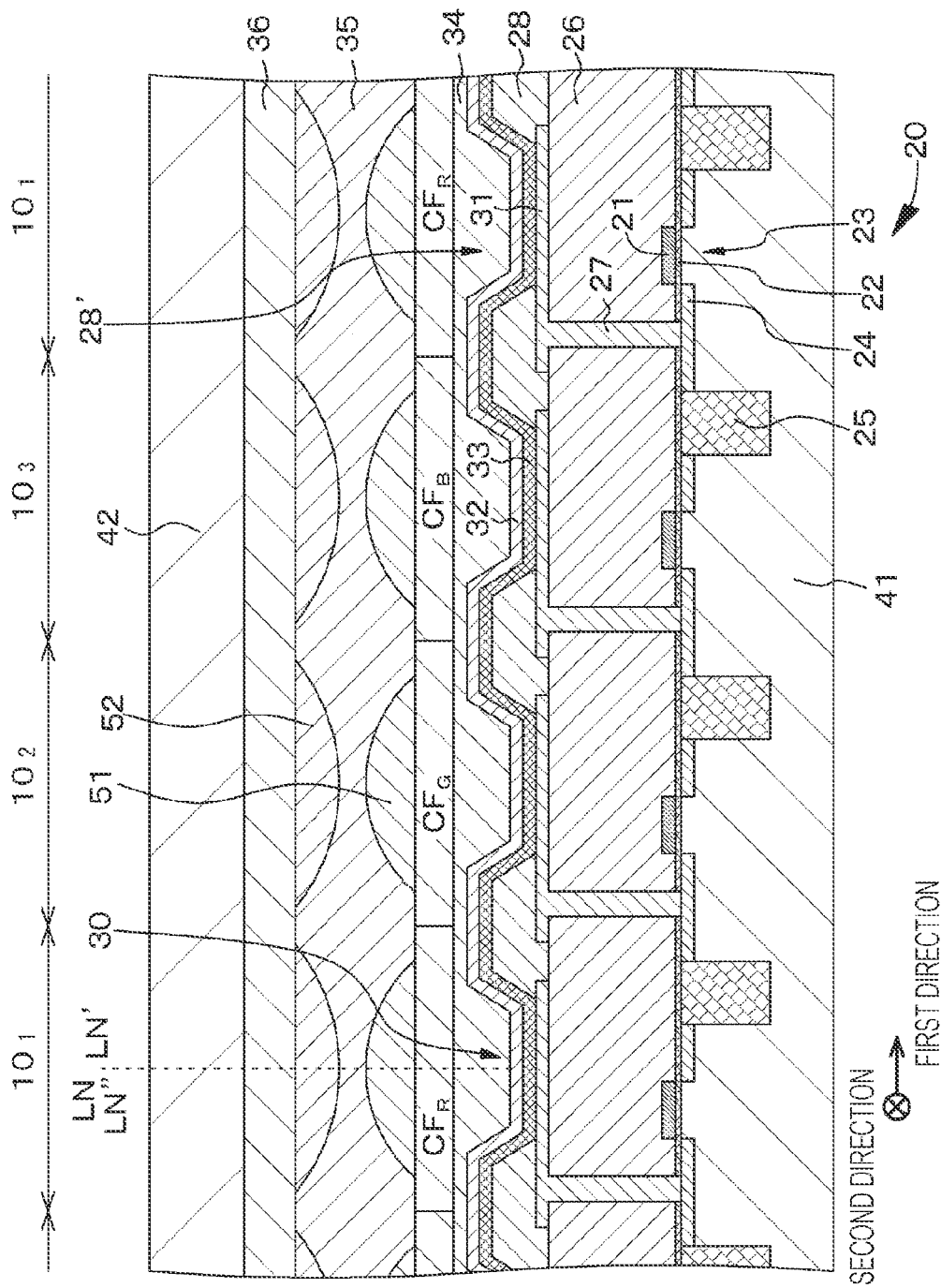
FIG. 1 is a schematic partial cross-sectional view of a display device of Example 1 (including a schematic partial cross-sectional view of a light emitting element of Example 1).

Hereinafter, the present disclosure will be described on the basis of examples with reference to the drawings, but the present disclosure is not limited to the examples, and various numerical values and materials in the examples are exemplary. Note that the description will be given in the following order.

1. General description of light emitting element of present disclosure, display device of present disclosure, and method for manufacturing display device of present disclosure
2. Example 1 (Light Emitting Element of Present Disclosure and Display Device of Present Disclosure)
3. Example 2 (Modification of Example 1)
4. Example 3 (Modifications of Examples 1 and 2)
5. Example 4 (Modifications of Examples 1 to 3)
6. Example 5 (Modifications of Examples 1 to 4 and Method for Manufacturing Display Device of Present Disclosure)
7. Example 6 (Application Examples of Display Devices of Examples 1 to 5)
8. Others General Description of Light Emitting Element of Present Disclosure, Display Device of Present Disclosure, and Method for Manufacturing Display Device of Present Disclosure In a display device of the present disclosure,
each light emitting element may have a resonator structure,
the first light emitting element emits red light, the second light emitting element emits green light, and the third light emitting element emits blue light,
the first light emitting element may be provided with wavelength selection means that allows the emitted red light to pass therethrough, and
the second light emitting element and the third light emitting element may not be provided with the wavelength selection means. Note that such a display device of the present disclosure may be referred to as a "display device of the first aspect" for convenience.

Hereinafter, the light emitting element of the present disclosure, the light emitting element of the present disclosure constituting the display device of the present disclosure including the display device of the first aspect described above, and the light emitting element of the present disclosure obtained by the method for manufacturing the light emitting element of the present disclosure may be collectively referred to as a "light emitting element or the like of the present disclosure".

In the light emitting element or the like of the present disclosure, a top portion of a first microlens and a top portion of a second microlens may be in contact with each other. Then, in this case, a flat portion may be formed by the top portion where the first microlens and the second microlens are in contact with each other, and further, when an area of the flat portion where the first microlens and the second microlens are in contact with each other is denoted by $S_{12}$ and an area of a light emitting region of a light emitting unit is denoted by $S_0$, the following inequality may be satisfied:

$$0.5 \leq S_0/S_{12} \leq 1.2.$$

Furthermore, in these cases, when a curvature radius of a portion of the first microlens excluding the flat portion is defined as $r_1$, and a curvature radius of a portion of the second microlens excluding the flat portion is defined as $r_2$, the following inequality may be satisfied:

$$r_2/r_1 > 1.$$

Furthermore, in these cases, an emission angle $\theta_{out}$ of light emitted from a central portion of the light emitting region of the light emitting unit, the light being emitted from a portion of the first microlens excluding the flat portion, passing through a bonding member, entering a portion of the second microlens excluding the flat portion, and being emitted from a second substrate with respect to the second substrate, may be 10 degrees or less. Note that the curvature radius $r_1$ of the portion of the first microlens excluding the flat portion refers to a curvature radius at a point $(H_1/4)$ from the flat portion in the height direction when the height of the first microlens is defined as $H_1$ in the cross section of the first microlens when the first microlens is cut in a virtual vertical plane in a direction parallel to a specific direction, including the optical axis of the first microlens. Similarly, the curvature radius $r_2$ of the portion of the second microlens excluding the flat portion refers to a curvature radius at a point $(H_2/4)$ from the flat portion in the height direction when the height of the second microlens is defined as $H_2$ in the cross section of the second microlens when the second microlens is cut in a virtual vertical plane in a direction parallel to a specific direction, including the optical axis of the second microlens. Here, the "specific direction" refers to a lateral direction of the display device, or refers to one direction in a case where the light emitting elements are arranged in a first direction and a second direction different from the first direction in a two-dimensional matrix in the display device. Note that in a case where the curvature radius in the first direction is different from the curvature radius in the second direction, a direction with a small curvature radius is referred to as a "specific direction".

In the light emitting element or the like of the present disclosure including the preferable aspect described above, in order to configure a focusing system, when the refractive index of a material constituting the first microlens is defined as $n_1$, the refractive index of a material constituting the second microlens is defined as $n_2$, and the refractive index of a material constituting the bonding member is defined as $n_0$, the inequalities $n_1 > n_0$ and $n_2 > n_0$ may be satisfied, and preferably, the equation of $n_1 = n_2 > n_0$ may be satisfied. Alternatively, in the light emitting element or the like of the present disclosure including the preferable aspect described above, in order to configure a divergent system, when the refractive index of the material constituting the first microlens is defined as $n_1$, the refractive index of the material constituting the second microlens is defined as $n_2$, and the refractive index of the material constituting the bonding member is defined as $n_0$, the inequalities of $n_1 < n_0$ and $n_2 < n_0$ may be satisfied.

Furthermore, in the light emitting element or the like of the present disclosure including the preferable aspect described above, the light emitting unit may have a convex-shaped cross-sectional shape toward the first substrate.

Furthermore, in the light emitting element or the like of the present disclosure including the preferable aspect described above, wavelength selection means may be provided between the light emitting unit and the first microlens, or wavelength selection means may be provided between the second substrate and the second microlens.

Examples of the wavelength selection means include a color filter layer. Examples of the color filter layer include a color filter layer that transmits not only red, green, and blue, but also specific wavelengths such as cyan, magenta, and yellow in some cases. The color filter layer includes a resin (for example, a photocurable resin) to which a colorant including a desired pigment or dye is added, and by selecting a pigment or dye, the color filter layer is adjusted so that light transmittance in a target wavelength region such as red, green, and blue is high and light transmittance in other wavelength regions is low. Such a color filter layer is only required to include a known color resist material. In a light emitting element that emits white light as described later, a transparent filter layer is only required to be disposed. Alternatively, examples of the wavelength selection means include a photonic crystal, a wavelength selection element (for example, wavelength selection means having a conductor lattice structure in which a lattice-shaped hole structure is provided in a conductor thin film disclosed in Japanese Patent Application Laid-Open No. 2008-177191, or wavelength selection means based on surface plasmon excitation using a diffraction grating) to which plasmon is applied, wavelength selection means using a dielectric multilayer film capable of allowing a specific wavelength to pass therethrough by multiple reflection in the thin film by laminating a dielectric thin film, and a thin film including an inorganic material such as thin film amorphous silicon.

Alternatively, as another aspect of the display device, there may be provided a display device including:
a first substrate and a second substrate; and
a plurality of light emitting element units each including a first light emitting element, a second light emitting element, and a third light emitting element provided on the first substrate,
in which each light emitting element may include a light emitting unit provided above the first substrate,
each light emitting element may have a resonator structure,
the first light emitting element may emit red light, the second light emitting element may emit green light, and the third light emitting element may emit blue light,
the first light emitting element may be provided with wavelength selection means that allows the emitted red light to pass therethrough, and
the wavelength selection means may not be provided in the second light emitting element and the third light emitting element.

In the display device of the present disclosure including another aspect of the display device described above, moreover, a fourth light emitting element that emits white light or a fourth light emitting element that emits light of a color other than red light, green light, or blue light can be further added. Examples of the arrangement of the light emitting elements include a stripe arrangement, a delta arrangement, a rectangle arrangement, and a pentile arrangement.

Specifically, the light emitting element or the like of the present disclosure includes a first electrode, an organic layer formed on the first electrode, a second electrode formed on the organic layer, and a protective layer (flattening layer) formed on the second electrode. The first microlens is formed on the protective layer. Then, light from the organic layer is emitted to the outside via the second electrode, the protective layer, the first microlens, the bonding member, the second microlens, and the second substrate, or via the second electrode, the protective layer, the first microlens, the second microlens, and the second substrate, and, in a case where the wavelength selection means is provided in these optical paths of the emitted light, also via the wavelength selection means.

As an arrangement relationship between the light emitting unit and the first microlens the second microlens, the following arrangement relationship can be exemplified.

[A] An optical axis of the first microlens coincides with an optical axis of the second microlens, and passes through the center of a light emitting region (as described later).

[B] The optical axis of the first microlens does not coincide with the optical axis of the second microlens, and the optical axis of the first microlens passes through the center of the light emitting region.

[C] The optical axis of the first microlens coincides with the optical axis of the second microlens, and does not pass through the center of the light emitting region.

[D] The optical axis of the first microlens does not coincide with the optical axis of the second microlens, the optical axis of the first microlens does not pass through the center of the light emitting region, and the optical axis of the second microlens does not pass through the center of the light emitting region.

In the case of [A] described above, the center point of the wavelength selection means (the center point when orthogonally projected onto a virtual plane (base substrate virtual plane) including the surface of the base substrate as described later) may pass through the center of the light emitting region. In the cases of [B], [C], and [D] described above, the center point of the wavelength selection means may pass through the center of the light emitting region, or may not pass through the center of the light emitting region.

In the case of [B], [C], and [D] described above, it is desirable that the distances $D_0$ and $D_1$ from the center of the light emitting region to the optical axis of the microlens be set to a larger value as the light emitting element is positioned in the peripheral portion of the display device. Similarly, in the case of [B], [C], and [D] described above and in a case where the center point of the wavelength selection means does not pass through the center of the light emitting region, it is desirable that the distance from the center of the light emitting region to the center point of the wavelength selection means be also set to a larger value as the light emitting element is positioned in the peripheral portion of the display device. Here, the "distance" is a distance when orthogonally projected onto the base substrate virtual plane. Furthermore, the "center of the light emitting region" refers to an area centroid point of the light emitting region, and the "center point of the wavelength selection means" refers to an area centroid point of the wavelength selection means.

The display device of the present disclosure is a top emission type (top surface emission type) display device (top surface emission type display device) that emits light from the second substrate. In a case where the wavelength selection means is provided in the top surface emission type display device, the wavelength selection means may be provided above the first substrate, but as described above, the wavelength selection means may be provided on the first substrate side or the second substrate side. In other words, the display device of the present disclosure includes the first substrate, the second substrate, and an image display unit interposed between the first substrate and the second substrate. In the image display unit, a plurality of light emitting elements having the preferable aspect and configurations described above is arranged in a two-dimensional matrix. Here, the light emitting element is formed on the first substrate side.

The first electrode is provided for each light emitting element. The organic layer is provided for each light emitting element, or is commonly provided in the light emitting elements. The second electrode is commonly provided in the light emitting element. That is, the second electrode is a so-called solid electrode. The first substrate is disposed below the base substrate, and the light emitting region is provided on the base substrate.

In the light emitting element or the like of the present disclosure, the first electrode can be in contact with a part of the organic layer, or a part of the first electrode can be in contact with the organic layer, or the first electrode can be in contact with the organic layer. In these cases, specifically, the size of the first electrode can be smaller than that of the organic layer, or the size of the first electrode can be the same as that of the organic layer, or the size of the first electrode can be larger than that of the organic layer, or an insulating layer can be formed between an edge portion of the first electrode and the organic layer. A region where the first electrode and the organic layer are in contact with each other is the light emitting region. The organic layer includes a light emitting layer including an organic light emitting material.

In the light emitting element or the like of the present disclosure, the organic layer has a laminated structure of at least two light emitting layers that emit different colors, and the color of light emitted in the laminated structure may be white light. That is, the organic layer constituting the red light emitting element, the organic layer constituting the green light emitting element, and the organic layer constituting the blue light emitting element can be formed to emit white light. Then, in this case, the organic layer that emits white light may have a laminated structure of a red light emitting layer that emits red light, a green light emitting layer that emits green light, and a blue light emitting layer that emits blue light. Alternatively, the organic layer that emits white light may have a laminated structure of a blue light emitting layer that emits blue light and a yellow light emitting layer that emits yellow light, or may have a laminated structure of a blue light emitting layer that emits blue light and an orange light emitting layer that emits orange light. Specifically, the organic layer can have a structure in which three layers of a red light emitting layer that emits red light (wavelength: 620 nm to 750 nm), a green light emitting layer that emits green light (wavelength: 495 nm to 570 nm), and a blue light emitting layer that emits blue light (wavelength: 450 nm to 495 nm) are laminated, and emits white light as a whole. Then, such an organic layer that emits white light and wavelength selection means that allows red light to pass therethrough are combined to configure a red light emitting element, an organic layer that emits white light and wavelength selection means that allows green light to pass therethrough are combined to configure a green light emitting element, and an organic layer that emits white light and wavelength selection means that allows blue light to pass therethrough are combined to configure a blue light emitting element. One pixel is formed by a combination of sub-pixels such as a red light emitting element, a green light emitting element, and a blue light emitting element. In some cases, one pixel may be constituted by the red light emitting element, the green light emitting element, the blue light emitting element, and a light emitting element that emits white light (or a light emitting element that emits complementary color light). In an aspect constituted of at least two light emitting layers that emit different colors, in practice, the light emitting layers that emit different colors may mix and not be clearly separated into the respective layers.

Alternatively, the organic layer may include one light emitting layer. In this case, the light emitting element can include, for example, a red light emitting element having an organic layer including a red light emitting layer, a green light emitting element having an organic layer including a green light emitting layer, or a blue light emitting element having an organic layer including a blue light emitting layer. That is, the organic layer constituting the red light emitting element may emit red light, the organic layer constituting the green light emitting element may emit green light, and the organic layer constituting the blue light emitting element may emit blue light. Then, one pixel is constituted by these three types of light emitting elements (sub-pixels).

Examples of a material constituting the protective layer (flattening layer) include acrylic resin, SiN, SiON, SiC, amorphous silicon (a-Si), $Al_2O_3$, and $TiO_2$. As a method for forming the protective layer, it can be formed on the basis of a known method such as various CVD methods, various coating methods, various PVD methods including a sputtering method and a vacuum vapor deposition method, and various printing methods such as a screen printing method. Furthermore, as the method for forming the protective layer, the atomic layer deposition (ALD) method can also be adopted. The protective layer may be shared by a plurality of light emitting elements, or may be individually provided in each light emitting element.

Examples of the material constituting the bonding member include thermosetting adhesives such as an acrylic adhesive, an epoxy-based adhesive, a urethane-based adhesive, a silicone-based adhesive, and a cyanoacrylate-based adhesive, and ultraviolet curable adhesives.

The first microlens and the second microlens can be constituted of, for example, a known transparent resin material such as an acrylic resin, and can be obtained by melt-flowing the transparent resin material, or can be obtained by etching back, can be obtained by a combination of a photolithography technique using a gray tone mask and an etching method, or can be obtained by a method for forming the transparent resin material into a lens shape on the basis of a nanoprint method. Examples of the outer shape of the first microlens and the second microlens include, but are not limited to, a circular shape.

In the light emitting element or the like of the present disclosure, specifically, the light emitting unit provided above the first substrate is provided on a base substrate formed on or above the first substrate.

Although not limited, a light emitting element driving unit is provided under or below the base substrate. The light emitting element driving unit includes, for example, a transistor (specifically, for example, an MOSFET) formed on a silicon semiconductor substrate constituting the first substrate, and a thin film transistor (TFT) provided on various substrates constituting the first substrate. The transistor or the TFT constituting the light emitting element driving unit may be connected to the first electrode via a contact hole (contact plug) formed in the base substrate. The light emitting element driving unit can have a known circuit configuration. The second electrode may be connected to the light emitting element driving unit via a contact hole (contact plug) formed in the base substrate at the outer peripheral portion of the display device. The light emitting element is formed on the first substrate side. The second electrode may be a common electrode in the plurality of light emitting elements. That is, the second electrode may be a so-called solid electrode.

The first substrate or the second substrate can include a silicon semiconductor substrate, a high strain point glass substrate, a soda glass ($Na_2O \cdot CaO \cdot SiO_2$) substrate, a borosilicate glass ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, various glass substrates having an insulating material layer formed on a surface thereof, a quartz substrate, a quartz substrate having an insulating material layer formed on a surface thereof, and an organic polymer (having a form of a polymer material such as a flexible plastic film, plastic sheet, or plastic substrate including a polymer material) exemplified by polymethyl methacrylate (polymethyl methacrylate, PMMA), polyvinyl alcohol (PVA), polyvinylphenol (PVP), polyethersulfone (PES), polyimide, polycarbonate, and polyethylene terephthalate (PET). The materials constituting the first substrate and the second substrate may be the same or different. However, the second substrate is required to be transparent to light from the light emitting element.

In a case where the first electrode functions as an anode electrode, examples of the material constituting the first electrode include a metal or an alloy (for example, an Ag—Pd—Cu alloy containing silver as a main component and containing 0.3 mass % to 1 mass % of palladium (Pd) and 0.3 mass- to 1 mass % of copper (Cu), an Al—Nd alloy, or an Al—Cu alloy) having a high work function value such as platinum (Pt), gold (Au), silver (Ag), chromium (Cr), tungsten (W), nickel (Ni), copper (Cu), iron (Fe), cobalt (Co), or tantalum (Ta). Furthermore, in a case where a conductive material having a small work function value and a high light reflectance such as aluminum (Al) and an alloy containing aluminum is used, the conductive material can be used as an anode electrode by improving hole injection properties by providing an appropriate hole injection layer or the like. The thickness of the first electrode can be 0.1 μm to 1 μm, for example. Alternatively, in a case where a light reflecting layer as described later is provided, examples of a material constituting the first electrode include various transparent conductive materials such as transparent conductive materials having indium oxide, indium-tin oxide (including indium tin oxide (ITO), Sn-doped $In_2O_3$, crystalline ITO, and amorphous ITO), indium-zinc oxide (indium zinc oxide (IZO)), indium-gallium oxide (IGO), indium-doped gallium-zinc oxide (IGZO and In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, NiO, spinel-type oxide, oxide with $YbFe_2O_4$ structure, gallium oxide, titanium oxide, niobium oxide, nickel oxide, or the like as a base layer. Alternatively, the transparent conductive material with excellent hole injection characteristics such as an oxide of indium and tin (ITO) or an oxide of indium and zinc (IZO)

can be laminated on a dielectric multilayer film or a reflective film having high light reflectivity such as aluminum (Al). On the other hand, in a case where the first electrode functions as a cathode electrode, it is desirable that the first electrode include a conductive material having a small work function value and a high light reflectance. However, the first electrode can also be used as a cathode electrode by improving the electron injection property by providing, for example, an appropriate electron injection layer in a conductive material having a high light reflectance used as an anode electrode.

In a case where the second electrode functions as a cathode electrode, a material constituting the second electrode (semi-light transmissive material or light transmissive material) is desirably constituted by a conductive material having a small work function value so as to transmit emission light and to efficiently inject electrons into the organic layer (light emitting layer). Examples thereof include metals or alloys having a small work function value such as aluminum (Al), silver (Ag), magnesium (Mg), calcium (Ca), sodium (Na), strontium (Sr), an alkali metal, an alkaline earth metal and silver (Ag), or the like [for example, an alloy of magnesium (Mg) and silver (Ag) (Mg—Ag alloy)], an alloy of magnesium-calcium (Mg—Ca alloy), and an alloy of aluminum (Al) and lithium (Li) (Al—Li alloy). Among them, a Mg—Ag alloy is preferable, and a volume ratio of magnesium and silver can be exemplified by Mg:Ag=5:1 to 30:1. Alternatively, as the volume ratio of magnesium to calcium, Mg:Ca=2:1 to 10:1 can be exemplified. As the thickness of the second electrode, 4 nm to 50 nm, preferably 4 nm to 20 nm, and more preferably 6 nm to 12 nm can be exemplified. Alternatively, at least one material selected from the group consisting of Ag—Nd—Cu, Ag—Cu, Au, and Al—Cu can be mentioned. Alternatively, the second electrode may have a laminated structure of the above-described material layer and a so-called transparent electrode (for example, a thickness of $3 \times 10^{-8}$ m to $1 \times 10^{-6}$ m) including, for example, ITO or IZO from the organic layer side. A bus electrode (auxiliary electrode) including a low-resistance material such as aluminum, an aluminum alloy, silver, a silver alloy, copper, a copper alloy, gold, or a gold alloy may be provided for the second electrode to reduce the resistance of the second electrode as a whole. It is desirable that the average light transmittance of the second electrode be 50% to 90%, and preferably 60% to 90%. On the other hand, in a case where the second electrode functions as an anode electrode, it is desirable that the second electrode be constituted of a conductive material that transmits emitted light and has a large work function value.

Examples of a method for forming the first electrode and the second electrode include a vapor deposition method including an electron beam vapor deposition method, a hot filament vapor deposition method, and a vacuum vapor deposition method, a sputtering method, a chemical vapor deposition method (CVD method), an MOCVD method, and a combination of an ion plating method and an etching method; various printing methods such as a screen printing method, an inkjet printing method, and a metal mask printing method; a plating method (electroplating method or electroless plating method); a lift-off method; a laser ablation method; a sol-gel method, or the like. According to various printing methods and plating methods, it is possible to directly form the first electrode and the second electrode having a desired shape (pattern). Note that, in a case where the second electrode is formed after the organic layer is formed, it is particularly preferable to form the second electrode on the basis of a film forming method in which the energy of film-formed particles is small such as a vacuum vapor deposition method or a film forming method such as an MOCVD method from the viewpoint of preventing occurrence of damage to the organic layer. When the organic layer is damaged, there is a possibility that a non-light emitting pixel (or a non-light emitting sub-pixel) called a "blinking point" due to generation of a leakage current occurs.

As described above, the organic layer includes a light emitting layer including the organic light emitting material. Specifically, the organic layer can have, for example, a laminated structure of a hole transport layer, a light emitting layer, and an electron transport layer, a laminated structure of a hole transport layer and a light emitting layer serving also as an electron transport layer, a laminated structure of a hole injection layer, a hole transport layer, a light emitting layer, an electron transport layer, and an electron injection layer, or the like. Examples of a method for forming the organic layer include a physical vapor deposition method (PVD method) such as a vacuum vapor deposition method; a printing method such as a screen printing method or an inkjet printing method; a laser transfer method in which a laminated structure of a laser absorption layer and an organic layer formed on a transfer substrate is irradiated with a laser to separate the organic layer on the laser absorption layer and transfer the organic layer, and various coating methods. In a case where the organic layer is formed on the basis of the vacuum vapor deposition method, for example, a so-called metal mask is used, and the organic layer can be obtained by depositing a material that has passed through an opening provided in the metal mask.

In the light emitting element or the display device of the present disclosure, the base substrate, the insulating layer, and an interlayer insulating layer are formed, and as an insulating material constituting these layers, a $SiO_x$-based material (a material constituting a silicon-based oxide film) such as $SiO_2$, non-doped silicate glass (NSG), boron-phosphorus silicate glass (BPSG), PSG, BSG, AsSG, SbSG, PbSG, spin-on glass (SOG), low temperature oxide (LTO, low temperature CVD-$SiO_2$), low-melting-point glass, and glass paste); SiN-based material including a SiON-based material; SiOC; SiOF; and SiCN can be mentioned. Alternatively, inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$) can be mentioned. Alternatively, various resins such as a polyimide-based resin, an epoxy-based resin, and an acryl-based resin, and low dielectric constant insulating materials (examples of the material include a material having a dielectric constant k ($=\varepsilon/\varepsilon_0$) of, for example, 3.5 or less, and specific examples thereof include fluorocarbons, a cycloperfluorocarbon polymer, benzocyclobutene, a cyclic fluorine-based resin, polytetrafluoroethylene, amorphous tetrafluoroethylene, polyaryl ether, fluorinated aryl ether, fluorinated polyimide, amorphous carbon, parylene (polyparaxylylene), and fluorinated fullerene) such as SiOCH, organic SOG, and a fluorine-based resin can be exemplified, and Silk (a trademark of The Dow Chemical Co.; a coating-type low-dielectric-constant interlayer insulating film material) and Flare (a trademark of Honeywell Electronic Materials Co.; a polyallyl ether (PAE)-based material) can also be exemplified. Then, these can be used alone or in appropriate combination. The insulating layer, the interlayer insulating layer, and the base substrate may have a single layer structure or a laminated structure. The insulating layer, the interlayer insulating layer, and the base substrate can be formed on the basis of known methods such as various CVD methods, various coating methods, various PVD methods including a sputtering method and a vacuum vapor deposition method, various printing methods such as a screen printing method, a plating method, an electrodeposition method, an immersion method, and a sol-gel method.

On the outermost surface (specifically, the outer surface of the second substrate) of the display device from which light is emitted, an ultraviolet absorbing layer, a contamination preventing layer, a hard coat layer, and an antistatic layer may be formed, or a protective member (for example, cover glass) may be disposed.

The display device of the present disclosure including the various preferable aspects and configurations described above can include an organic electroluminescence display device (organic EL display device), and the light emitting element can include an organic electroluminescence element (organic EL element).

The organic EL display device preferably has a resonator structure in order to improve the light extraction efficiency much further. Specifically, light emitted from the light emitting layer resonates between a first interface (alternatively, in a structure in which an interlayer insulating layer is provided under the first electrode and a light reflecting layer is provided under the interlayer insulating layer, a first interface constituted by an interface between the light reflecting layer and the interlayer insulating layer) constituted by an interface between the first electrode and the organic layer and a second interface constituted by an interface between the second electrode and the organic layer, and a part of the light is emitted from the second electrode. Then, when the distance from the maximum light emission position of the light emitting layer to the first interface is defined as $L_1$, the optical distance is defined as $OL_1$, the distance from the maximum light emission position of the light emitting layer to the second interface is defined as $L_2$, the optical distance is defined as $OL_2$, and $m_1$ and $m_2$ are defined as integers, the following Inequalities (1-1) and (1-2) are satisfied.

$$0.7\{-\Phi_1/(2\pi)+m_1\} \le 2\times OL_1/\lambda \le 1.2\{-\Phi_1/(2\pi)+m_1\} \quad (1\text{-}1)$$

$$0.7\{-\Phi_2/(2\pi)+m_2\} \le 2\times OL_2/1.2\{-\Phi_2/(2\pi)+m_2\} \quad (1\text{-}2)$$

where:
λ: maximum peak wavelength of spectrum of light generated in light emitting layer (alternatively, a desired wavelength of light generated in the light emitting layer)
$\Phi_1$: a phase shift amount (unit: radian) of light reflected at the first interface, where $-2\pi < \Phi_1 \le 0$
$\Phi_2$: a phase shift amount (unit: radian) of light reflected at the second interface, where $-2\pi < \Phi_2 \le 0$.

Here, the value of $m_1$ is a value of 0 or more, and the value of $m_2$ is a value of 0 or more independently of the value of $m_1$. However, a form of $(m_1, m_2)=(0, 0)$, a form of $(m_1, m_2)=(0, 1)$, a form of $(m_1, m_2)=(1, 0)$, and a form of $(m_1, m_2)=(1, 1)$ can be exemplified.

The distance $L_1$ from the maximum light emission position of the light emitting layer to the first interface refers to an actual distance (physical distance) from the maximum light emission position of the light emitting layer to the first interface, and the distance $L_2$ from the maximum light emission position of the light emitting layer to the second interface refers to an actual distance (physical distance) from the maximum light emission position of the light emitting layer to the second interface. Furthermore, the optical distance is also referred to as an optical path length, and generally refers to n×L when a light beam passes through a medium having a refractive index n by a distance L. The same applies to the following. Therefore, when the average refractive index is defined as $n_{ave}$, the following equations are established:

$$OL_1 = L_1 \times n_{ave}, \text{ and}$$

$$OL_2 = L_2 \times n_{ave}.$$

Here, the average refractive index $n_{ave}$ is obtained by summing up the product of the refractive index and the thickness of each layer constituting the organic layer (alternatively, the organic layer, the first electrode, and the interlayer insulating layer) and dividing the sum by the thickness of the organic layer (alternatively, the organic layer, the first electrode, and the interlayer insulating layer).

The first electrode or the light reflecting layer and the second electrode absorb a part of the incident light and reflect the rest. Therefore, a phase shift occurs in the reflected light. The phase shift amounts $\Phi_1$ and $\Phi_2$ can be obtained by measuring the values of the real number part and the imaginary number part of the complex refractive index of a material constituting the first electrode or the light reflecting layer and the second electrode using, for example, an ellipsometer and performing calculation on the basis of these values (for example, see "Principles of Optic", Max Born and Emil Wolf, 1974 (PERGAMON PRESS)). The refractive index of the organic layer, the interlayer insulating layer, and the like can also be obtained by measuring using an ellipsometer.

Examples of a material constituting the light reflecting layer include aluminum, an aluminum alloy (for example, Al—Nd or Al—Cu), an Al/Ti laminated structure, an Al—Cu/Ti laminated structure, chromium (Cr), silver (Ag), a silver alloy (for example, Ag—Pd—Cu, Ag—Sm—Cu), copper, a copper alloy, gold, and a gold alloy, and for example, it can be formed by a vapor deposition method including an electron beam vapor deposition method, a hot filament vapor deposition method, and a vacuum vapor deposition method, a sputtering method, a CVD method, and an ion plating method; a plating method (electroplating method or electroless plating method); a lift-off method; a laser ablation method; a sol-gel method, or the like.

As described above, in the organic EL display device having the resonator structure, actually, the red light emitting element (in some cases, the red light emitting element configured by combining an organic layer that emits white light and the wavelength selection means that allows red light to pass therethrough) including the organic layer that emits white light causes red light emitted from the light emitting layer to resonate, and emits reddish light (light having a light spectrum peak in a red region) from the second electrode. Furthermore, a green light emitting element (in some cases, the green light emitting element configured by combining an organic layer that emits white light and the wavelength selection means that allows green light to pass therethrough) including an organic layer that emits white light causes green light emitted from the light emitting layer to resonate, and emits greenish light (light having a light spectrum peak in a green region) from the second electrode. Furthermore, a blue light emitting element (in some cases, the blue light emitting element configured by combining an organic layer that emits white light and the wavelength selection means that allows blue light to pass therethrough) including an organic layer that emits white light causes blue light emitted from the light emitting layer to resonate, and emits bluish light (light having a light spectrum peak in a blue region) from the second electrode. That is, each light emitting element is only required to be designed by determining a desired wavelength λ (specifically, a red wavelength, a green wavelength, and a blue wavelength) of light generated in the light emitting layer and obtaining various parameters such as $OL_1$ and $OL_2$ in each of the red light emitting element, the green light emitting element, and the blue light emitting element on the basis of Inequalities (1-1) and (1-2). For example, paragraph [0041] of Japanese Patent Application Laid-Open No. 2012-216495 discloses an organic EL element having a resonator structure in which an organic layer is set as a resonance part, and describes that a film thickness of the organic layer is preferably 80 nm or more and 500 nm or less, and more preferably 150 nm or more and 350 nm or less because a distance from a light emission point (light emission surface) to a reflection surface can be appropriately adjusted.

In the organic EL display device, it is desirable that the thickness of the hole transport layer (hole supply layer) and the thickness of the electron transport layer (electron supply layer) be substantially equal. Alternatively, the electron transport layer (electron supply layer) may be thicker than the hole transport layer (hole supply layer), and this makes it possible to supply electrons necessary for high efficiency at a low drive voltage and sufficient to the light emitting layer. That is, by disposing the hole transport layer between the first electrode corresponding to the anode electrode and the light emitting layer and forming the hole transport layer with a film thickness thinner than that of the electron transport layer, supply of holes can be increased. Then, as a result, it is possible to obtain a carrier balance in which there is no excess or deficiency of holes and electrons and the carrier supply amount is sufficiently large, so that high light emission efficiency can be obtained. Furthermore, since there is no excess or deficiency of holes and electrons, carrier balance is hardly lost, drive deterioration is suppressed, and a light emission lifetime can be extended.

The display device can be used as, for example, a monitor device constituting a personal computer, or can be used as a monitor device incorporated in a television receiver, a mobile phone, a personal digital assistant (PDA), or a game device. Alternatively, the present disclosure can be applied to an electronic view finder (EVF) and a head mounted display (HMD). Alternatively, it is possible to configure an image display device in an electronic book, electronic paper such as an electronic newspaper, a bulletin board such as a signboard, a poster, or a blackboard, a rewritable paper as a substitute for printer paper, a display unit of a home appliance, a card display unit such as a loyalty card, an electronic advertisement, or an electronic POP advertisement. Using the display device of the present disclosure as a light emitting device, various lighting devices including a backlight device for a liquid crystal display device and a planar light source device can be configured. The head mounted display includes, for example, (a) a frame mounted on a head of an observer, and
(b) an image display device attached to the frame,
in which the image display device includes
(A) a display device of the present disclosure, and
(B) an optical device in which light emitted from the display device of the present disclosure is incident and emitted, and
in which the optical device includes (B-1) a light guide plate through the inside of which light incident from the display device of the present disclosure propagates by total reflection and then is emitted toward an observer,
(B-2) first deflection means (for example, including a volume hologram diffraction grating film) that deflects the light incident on the light guide plate such that the light incident on the light guide plate is totally reflected inside the light guide plate, and
(B-3) second deflection means (for example, including a volume hologram diffraction grating film) that deflects the light propagated by total reflection through the inside of the light guide plate a plurality of times in order to emit the light propagated by total reflection through the inside of the light guide plate from the light guide plate.

Example 1

Example 1 relates to the light emitting element of the present disclosure and the display device of the present disclosure. FIG. 1 illustrates a schematic partial cross-sectional view of the display device of Example 1. The display device of Example 1 includes an organic EL display device, and the light emitting element includes an organic EL element. Furthermore, the display device of Example 1 is a top emission type (top surface emission type) display device (top surface emission type display device) that emits light from the second substrate, and a color filter layer as wavelength selection means is provided on the first substrate side. That is, the color filter layer has an on-chip color filter layer structure (OCCF structure).

A light emitting element 10 of Example 1 includes
a first substrate 41 and a second substrate 42,
a light emitting unit 30 provided above the first substrate 41,
a first microlens 51 formed above the light emitting unit 30 and having a convex shape toward the second substrate 42,
a second microlens 52 provided on the second substrate 42 and having a convex shape toward the first microlens 51, and
a bonding member 35 interposed between the first microlens 51 and the second microlens 52.

Furthermore, a display device of Example 1 includes
a first substrate 41 and a second substrate 42, and
a plurality of light emitting element units each including
a first light emitting element $10_1$, a second light emitting element $10_2$, and a third light emitting element $10_3$ provided on the first substrate 41,
in which each light emitting element 10 includes
a light emitting unit 30 provided above the first substrate 41,
a first microlens 51 formed above the light emitting unit 30 and having a convex shape toward the second substrate 42,
a second microlens 52 provided on the second substrate 42 and having a convex shape toward the first microlens 51, and
a bonding member 35 interposed between the first microlens 51 and the second microlens 52.

Then, in the light emitting element 10 of Example 1, in order to form a focusing system, when the refractive index of the material constituting the first microlens 51 is defined as $n_1$, the refractive index of the material constituting the second microlens 52 is defined as $n_2$, and the refractive index of the material constituting the bonding member 35 is defined as $n_0$, the inequalities $n_1>n_0$ and $n_2>n_0$ may be satisfied, and preferably, the equation of $n_1=n_2>n_0$ may be satisfied. Specifically, the following equations are established:

$$n_1=n_2=1.55 \text{ and}$$

$$n_0=1.35.$$

The first microlens 51 and the second microlens 52 include an acrylic adhesive, and the bonding member (sealing resin layer) 35 also includes an acrylic adhesive (however, the acrylic adhesive is different from the acrylic adhesive constituting the first microlens 51 and the second microlens 52). The first microlens 51 and the second microlens 52 are bonded to each other by the bonding member 35. Then, an optical axis LN' of the first microlens 51 coincides with an optical axis LN'' of the second microlens 52, and passes through a center LN of a light emitting region. Furthermore, the center point of the wavelength selection means of the wavelength selection means (color filter layer CF) passes through the center LN of the light emitting region.

Furthermore, in Example 1, the light emitting element 10 includes wavelength selection means between the light emitting unit 30 and the first microlens 51. Specifically, the wavelength selection means includes color filter layers $CF_R$, $CF_G$, and $CF_N$, and the color filter layers $CF_R$, $CF_G$, and $CF_N$ are provided on the first substrate side.

In the display device of Example 1 or Examples 2 to 5 as described later, one pixel includes three light emitting elements of a first light emitting element $10_1$, a second light emitting element $10_2$, and a third light emitting element $10_3$. An organic layer 33 constituting the first light emitting element $10_1$, the organic layer 33 constituting the second light emitting element $10_2$, and the organic layer 33 constituting the third light emitting element $10_3$ emit white light. That is, the first light emitting element $10_1$ that emits red light includes a combination of the organic layer 33 that emits white light and the red color filter layer $CF_R$. The second light emitting element $10_2$ that emits green light includes a combination of the organic layer 33 that emits white light and the green color filter layer $CF_G$. The third light emitting element $10_3$ that emits blue light includes a combination of the organic layer 33 that emits white light and the blue color filter layer $CF_B$. The organic layer 33 emits white light as a whole. The number of pixels is, for example, 1920×1080, one light emitting element (display element) constitutes one sub-pixel, and the number of light emitting elements (specifically, organic EL elements) is three times the number of pixels.

In the display device of Example 1 or Examples 2 to as described later, specifically, the light emitting element includes
 a first electrode 31,
 an organic layer 33 formed on the first electrode 31,
 a second electrode 32 formed on the organic layer 33,
 a protective layer (flattening layer) 34 formed on the second electrode 32, and
 a color filter layer CF ($CF_R$, $CF_G$, $CF_B$) formed on the protective layer 34.

Then, light from the organic layer 33 is emitted to the outside via the second electrode 32, the protective layer 34, the color filter layer CF, the first microlens 51, the bonding member 35, the second microlens 52, a base layer 36, and the second substrate 42.

The first electrode 31 is provided for each of the light emitting elements $10_1$, $10_2$, and $10_3$, and is formed on a base substrate 26. The second electrode 32 is commonly provided in the light emitting elements $10_1$, $10_2$, and $10_3$. That is, the second electrode 32 is a so-called solid electrode. The first substrate 41 is disposed below the base substrate 26 constituted of an insulating material, and the second substrate 42 is disposed above top surfaces of the color filter layers $CF_R$, $CF_G$, and $CF_B$.

A light emitting element driving unit is provided below the base substrate 26 including SiON formed on the basis of the CVD method. The light emitting element driving unit can have a known circuit configuration. The light emitting element driving unit includes a transistor (specifically, the MOSFET) formed on a silicon semiconductor substrate corresponding to the first substrate 41. The transistor 20 including the MOSFET includes a gate insulating layer 22 formed on the first substrate 41, a gate electrode 21 formed on the gate insulating layer 22, a source/drain region 24 formed on the first substrate 41, a channel formation region 23 formed between the source/drain regions 24, and an element isolation region 25 surrounding the channel formation region 23 and the source/drain region 24. The transistor 20 and the first electrode 31 are electrically connected via a contact plug 27 provided in the base substrate 26. Note that, in the drawings, one transistor 20 is illustrated for one light emitting element driving unit.

Furthermore, as described above, the first electrode 31 is provided for each light emitting element on the base substrate 26 including an insulating material. Then, an insulating layer 28 having an opening section 28' in which the first electrode 31 is exposed at the bottom is formed on the base substrate 26, and the organic layer 33 is formed at least on the first electrode 31 exposed at the bottom of the opening section 28'. Specifically, the organic layer 33 is formed from the top of the first electrode 31 exposed at the bottom of the opening section 28' to the top of the insulating layer 28, and the insulating layer 28 is formed from the first electrode 31 to the top of the base substrate 26. The portion of the organic layer 33 that actually emits light is surrounded by the insulating layer 28. That is, the light emitting region is constituted by a region where the first electrode 31 and the organic layer 33 formed on the first electrode 31 are in contact with each other, is provided on the base substrate 26, and a region of the organic layer 33 surrounded by the insulating layer 28 corresponds to the light emitting region. The insulating layer 28 and the second electrode 32 are covered with a protective layer 34 including SiN.

The second electrode 32 is connected to the light emitting element driving unit via a contact hole (contact plug) (not illustrated) formed in the base substrate 26 at the outer peripheral portion of the display device. Note that, at the outer peripheral portion of the display device, an auxiliary electrode connected to the second electrode 32 may be provided below the second electrode 32, and the auxiliary electrode may be connected to the light emitting element driving unit.

The first electrode 31 functions as an anode electrode, and the second electrode 32 functions as a cathode electrode. The first electrode 31 includes a light reflecting material, specifically, an Al—Nd alloy, and the second electrode 32 includes a transparent conductive material such as ITO. The first electrode 31 is formed on the basis of a combination of a vacuum vapor deposition method and an etching method. Furthermore, a film of the second electrode 32 is particularly formed by a film forming method in which the energy of film-formed particles is small, such as a vacuum vapor deposition method. The first substrate 41 includes a silicon semiconductor substrate, and the second substrate 42 includes a glass substrate.

In Example 1, the organic layer 33 has a laminated structure of a hole injection layer (HIL), a hole transport layer (HTL), a light emitting layer, an electron transport layer (ETL), and an electron injection layer (EIL). The light emitting layer includes at least two light emitting layers that emit light with different colors, and the light emitted from the organic layer 33 is white. Specifically, the light emitting layer has a structure in which three layers of a red light emitting layer that emits red light, a green light emitting layer that emits green light, and a blue light emitting layer that emits blue light are laminated. The light emitting layer may have a structure in which two layers of a blue light emitting layer that emits blue light and a yellow light emitting layer that emits yellow light are laminated (white light is emitted as a whole), or a structure in which two layers of a blue light emitting layer that emits blue light and an orange light emitting layer that emits orange light are laminated (white light is emitted as a whole). As described above, the first light emitting element $10_1$ for displaying red is provided with the red color filter layer $CF_R$, the second light emitting element $10_2$ for displaying green is provided with the green color filter layer $CF_G$, and the third light emitting element $10_3$ for displaying blue is provided with the blue color filter layer $CF_B$. The first light emitting element $10_1$, the second light emitting element $10_2$, and the third light emitting element $10_3$ have the same configuration and structure except for the color filter layers $CF_R$, $CF_G$, and $CF_B$.

The hole injection layer is a layer that enhances hole injection efficiency and functions as a buffer layer that prevents leakage, and has a thickness of, for example, about 2 nm to 10 nm. The hole injection layer includes, for example, a hexaazatriphenylene derivative represented by the following Formula (A) or Formula (B). Note that when the end surface of the hole injection layer is in contact with the second electrode, it becomes a main cause of occurrence of luminance variation between pixels, leading to deterioration of display image quality.

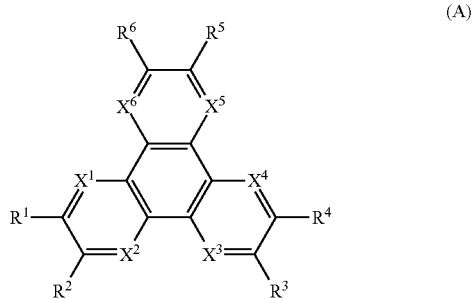

(A)

Here, $R^1$ to $R^6$ are each independently a substituent selected from hydrogen, halogen, a hydroxy group, an amino group, an arylamino group, a substituted or unsubstituted carbonyl group having 20 or less carbon atoms, a substituted or unsubstituted carbonyl ester group having 20 or less carbon atoms, a substituted or unsubstituted alkyl group having 20 or less carbon atoms, a substituted or unsubstituted alkenyl group having 20 or less carbon atoms, a substituted or unsubstituted alkoxy group having 20 or less carbon atoms, a substituted or unsubstituted aryl group having 30 or less carbon atoms, a substituted or unsubstituted heterocyclic group having 30 or less carbon atoms, a nitrile group, a cyano group, a nitro group, or a silyl group, and adjacent $R^m$ (m=1 to 6) may be bonded to each other via a cyclic structure. Furthermore, $X^1$ to $X^6$ each independently represent a carbon atom or a nitrogen atom.

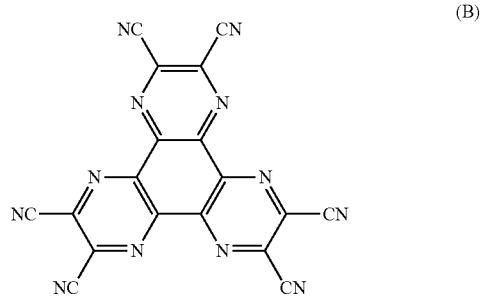 [SMILES: N#Cc1nc2c3nc(C#N)c(C#N)nc3c3nc(C#N)c(C#N)nc3c2nc1C#N]

(B)

The hole transport layer is a layer that enhances hole transport efficiency to the light emitting layer. In the light emitting layer, when an electric field is applied, recombination of electrons and holes occurs, and light is generated. The electron transport layer is a layer that enhances electron transport efficiency to the light emitting layer, and the electron injection layer is a layer that enhances electron injection efficiency to the light emitting layer.

The hole transport layer includes 4,4',4''-tris(3-methylphenylphenylamino) triphenylamine (m-MTDATA) or α-naphthylphenyldiamine (αNPD) having a thickness of about 40 nm, for example.

The light emitting layer is a light emitting layer that generates white light by color mixing, and is formed by laminating a red light emitting layer, a green light emitting layer, and a blue light emitting layer, for example, as described above.

In the red light emitting layer, when an electric field is applied, a part of holes injected from the first electrode 31 and a part of electrons injected from the second electrode 32 are recombined to generate red light. Such a red light emitting layer contains, for example, at least one kind of material among a red light emitting material, a hole transporting material, an electron transporting material, and a both charge transporting material. The red light emitting material may be a fluorescent material or a phosphorescent material. The red light emitting layer having a thickness of about 5 nm is formed by mixing 30 mass %, of 2,6-bis[(4'-methoxydiphenylamino)styryl]-1,5-dicyanonaphthalene (BSN) with 4,4-bis(2,2-diphenylvinyl)biphenyl (DPVBi), for example.

In the green light emitting layer, when an electric field is applied, a part of holes injected from the first electrode 31 and a part of electrons injected from the second electrode 32 are recombined to generate green light. Such a green light emitting layer contains, for example, at least one kind of material among a green light emitting material, a hole transporting material, an electron transporting material, and a both charge transporting material. The green light emitting material may be a fluorescent material or a phosphorescent material. The green light emitting layer having a thickness of about 10 nm is formed by mixing 5 mass % of coumarin 6 with DPVBi, for example.

In the blue light emitting layer, when an electric field is applied, a part of holes injected from the first electrode 31 and a part of electrons injected from the second electrode 32 are recombined to generate blue light. Such a blue light emitting layer contains, for example, at least one kind of material among a blue light emitting material, a hole transporting material, an electron transporting material, and a both charge transporting material. The blue light emitting material may be a fluorescent material or a phosphorescent material. The blue light emitting layer having a thickness of about 30 nm is formed by mixing 2.5 mass % of 4,4'-bis[2-{4-(N,N-diphenylamino)phenyl}vinyl]biphenyl (DPAVBi) with DPVBi, for example.

The electron transport layer having a thickness of about 20 nm includes, for example, 8-hydroxyquinoline aluminum (Alq3). The electron injection layer having a thickness of about 0.3 nm includes, for example, LiF or $Li_2O$, or the like.

However, the materials constituting each layer are examples, and are not limited to these materials. Furthermore, for example, the light emitting layer may include the blue light emitting layer and the yellow light emitting layer, or may include the blue light emitting layer and the orange light emitting layer.

Hereinafter, an outline of a method for manufacturing the light emitting element of Example 1 illustrated in FIG. 1 will be described.

[Step-100]

First, the light emitting element driving unit is formed on a silicon semiconductor substrate (first substrate 41) on the basis of a known MOSFET manufacturing process.

[Step-110]

Next, the base substrate 26 is formed on the entire surface by a CVD method.

[Step-120]

Next, a connection hole is formed in a portion of the base substrate 26 positioned above one source/drain region of the transistor 20 on the basis of the photolithography technique and an etching technique. Thereafter, a metal layer is formed on the base substrate 26 including the connection hole on the basis of, for example, a sputtering method, and then the metal layer is patterned on the basis of the photolithography technique and the etching technique, whereby the first electrode 31 can be formed on a part of the base substrate 26. The first electrode 31 is separated for each light emitting element. In addition, a contact hole (contact plug) 27 that electrically connects the first electrode 31 and the transistor 20 can be formed in the connection hole.

[Step-130]

Thereafter, for example, the insulating layer 28 is formed on the entire surface on the basis of the CVD method, and then the opening section 28' is formed in a part of the insulating layer 28 on the first electrode 31 on the basis of the photolithography technique and the etching technique. The first electrode 31 is exposed at the bottom of the opening section 28'.

[Step-140]

Next, a film of the organic layer 33 is formed on the first electrode 31 and the insulating layer 28 by, for example, a PVD method such as a vacuum vapor deposition method or a sputtering method, a coating method such as a spin coating method or a die coating method, or the like. Next, the second electrode 32 is formed on the entire surface on the basis of, for example, a vacuum vapor deposition method or the like. In this way, the organic layer 33 and the second electrode 32 can be formed on the first electrode 31.

[Step-150]

Thereafter, the protective layer 34 is formed on the entire surface by, for example, a CVD method, a PVD method, or a coating method. Then, the color filter layers $CF_R$, $CF_G$, and $CF_B$ are formed on the protective layer 34 on the basis of a known method.

[Step-160]

Next, a first lens formation layer for forming the first microlens 51 is formed on the color filter layer CF ($CF_R$, $CF_G$, $CF_B$), and a first resist material layer is formed thereon. Then, the first resist material layer is patterned and further subjected to heat treatment to form the first resist material layer into a lens shape. Next, the first resist material layer and the first lens formation layer are etched back to transfer the shape formed in the first resist material layer to the first lens formation layer. In this way, the first microlens 51 can be obtained.

[Step-170]

On the other hand, a base layer 36 is formed on the second substrate 42, a second lens formation layer for forming the second microlens 52 is formed on the base layer 36, and a second resist material layer is formed thereon. Then, the second resist material layer is patterned and further subjected to heat treatment to form the second resist material layer into a lens shape. Next, the second resist material layer and the second lens formation layer are etched back to transfer the shape formed in the second resist material layer to the second lens formation layer. In this way, the second microlens 52 can be obtained.

[Step-180]

Then, the first substrate 41 and the second substrate 42, specifically, the first microlens 51 and the second microlens 52 are bonded to each other via the bonding member (sealing resin layer) 35. In this way, the display device (organic EL display device) illustrated in FIG. 1 can be obtained.

In the light emitting element or the display device of Example 1, by providing the first microlens and the second microlens, the light from the organic layer can be converged (or diverged) to a desired state, and as a result, the viewing angle characteristic can be controlled, and the front light extraction efficiency can be improved. Moreover, in the manufacturing step of the light emitting element, the first microlens convex upward is only required to be formed on the flat color filter layer in [Step-160] described above, and the second microlens convex upward is only required to be formed on the flat base layer in [Step-170] described above independently of the formation of the first microlens. Therefore, for example, as compared with a case where a step of forming the first microlens convex upward on the flat color filter layer, then forming the flattening layer on the entire surface, and further forming the second microlens convex upward on the flattening layer is assumed, the manufacturing step of the light emitting element and the display device does not greatly increase, and the manufacturing step can be simplified.

Example 2

Figure 2:
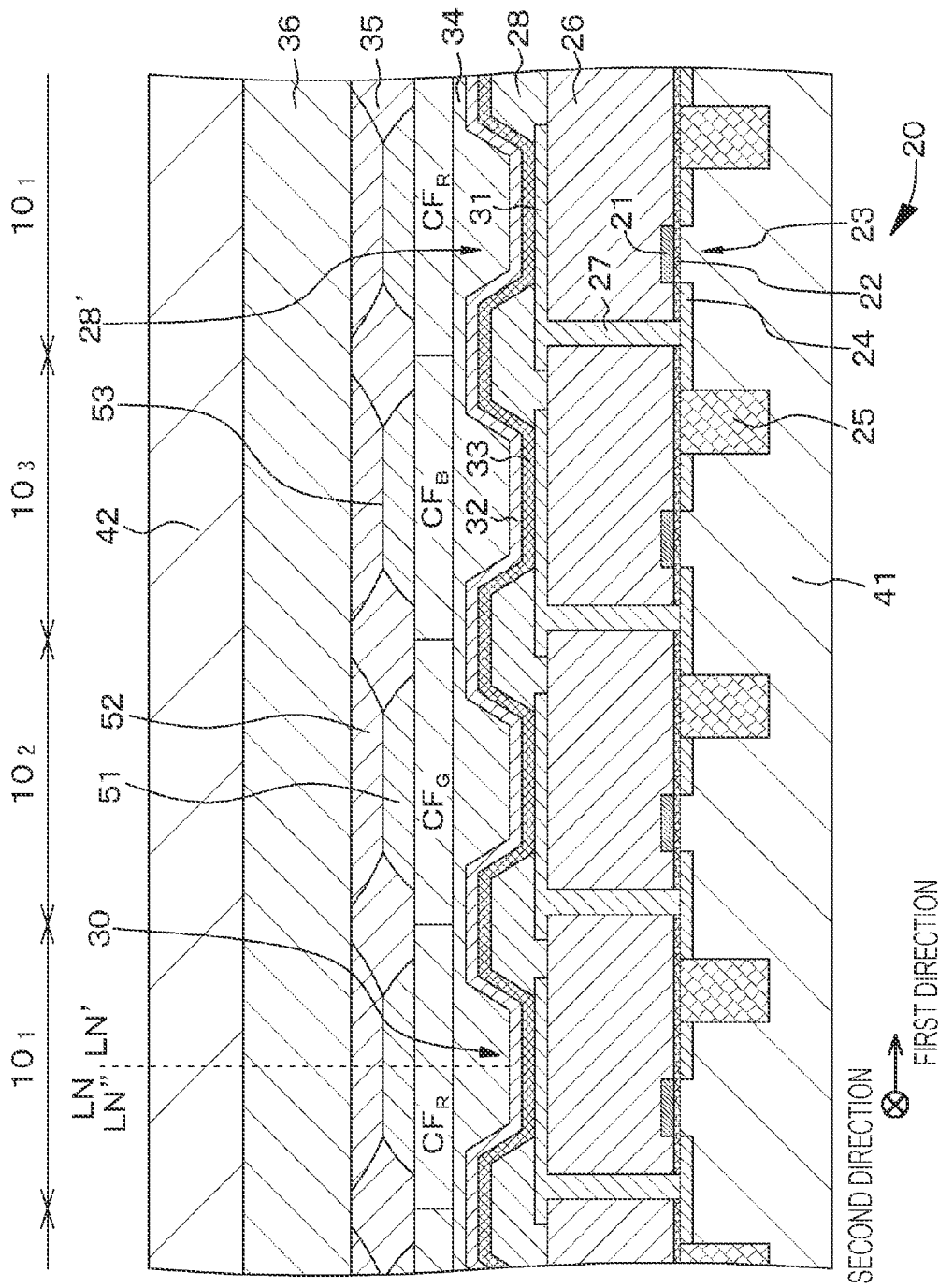
FIG. 2 is a schematic partial cross-sectional view of a display device of Example 2 (including a schematic partial cross-sectional view of a light emitting element of Example 2).
Figure 3:
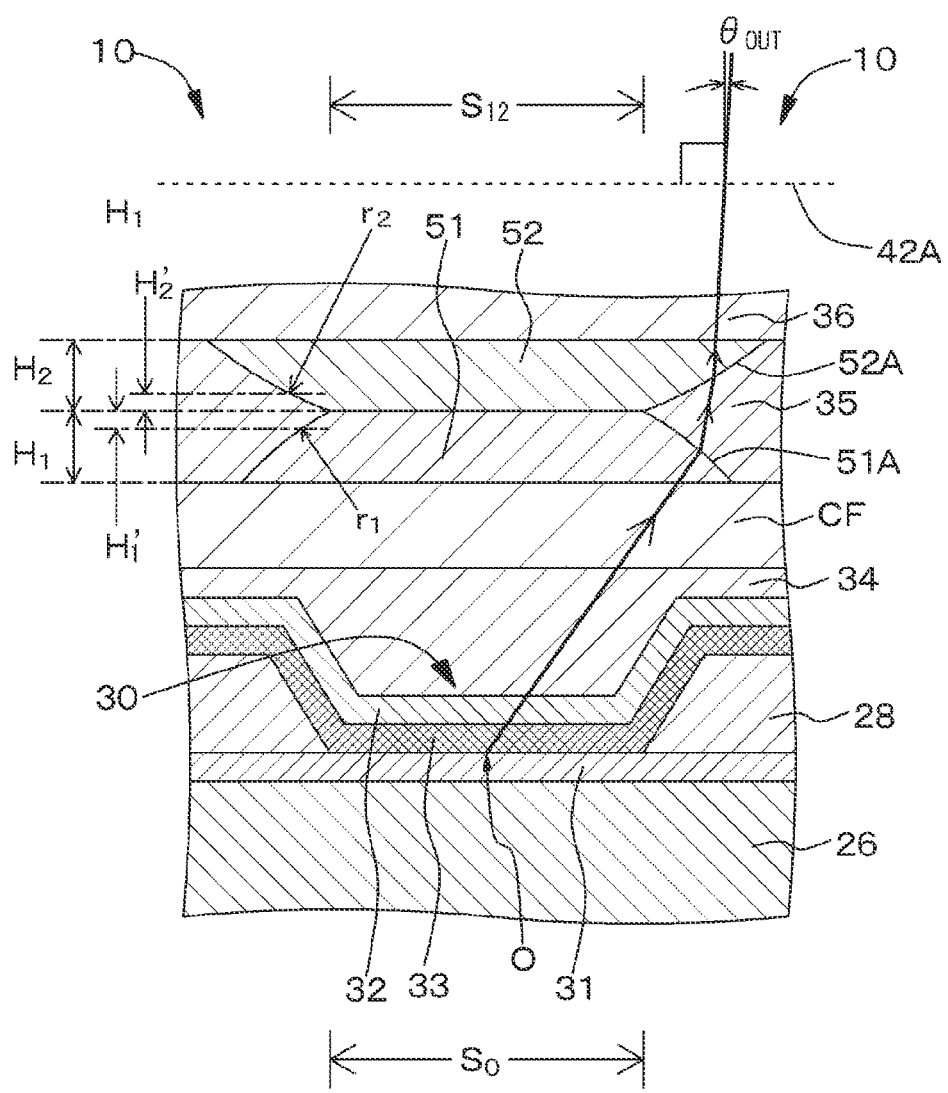
FIG. 3 is a schematic partial cross-sectional view of the light emitting element of Example 2.

Example 2 is a modification of Example 1. FIG. 2 illustrates a schematic partial cross-sectional view of a display device of Example 2 (including a schematic partial cross-sectional view of a light emitting element of Example 2), and FIG. 3 illustrates a schematic partial cross-sectional view of a light emitting element of Example 2. Note that in the behavior of the light beam illustrated in FIG. 3, a state in which the traveling direction of the light beam changes due to the difference in refractive index between the materials constituting each layer is not illustrated.

In the light emitting element 10 of Example 2, a top portion of the first microlens 51 and a top portion of the second microlens 52 are in contact with each other. Then, a flat portion 53 is formed by the top portion where the first microlens 51 and the second microlens 52 are in contact with each other. As illustrated in FIG. 3, when an area of the flat portion 53 is $S_{12}$ and an area of the light emitting region of the light emitting unit 30 is $S_0$, the following inequality is satisfied:

$$0.5 \leq S_0/S_{12} \leq 1.2.$$

Furthermore, when a curvature radius of a portion 51A of the first microlens 51 excluding the flat portion 53 is defined as $r_1$, and a curvature radius of a portion 52A of the second microlens 52 excluding the flat portion 53 is defined as $r_2$, the following inequality is satisfied:

$$r_2/r_1 > 1.$$

Furthermore, an emission angle $\theta_{out}$ of light emitted from a central portion O of the light emitting region of the light emitting unit 30, the light being emitted from a portion of the first microlens 51 excluding the flat portion 53, passing through the bonding member 35, entering a portion of the second microlens 52 excluding the flat portion 53, and being emitted from the second substrate 42 with respect to the second substrate 42, is 10 degrees or less. The first microlens 51 and the second microlens 52 are bonded to each other by the bonding member 35.

In the light emitting element 10 of Example 2, light from the organic layer 33 is emitted to the outside via the second electrode 32, the protective layer 34, the color filter layer CF, the first microlens 51, the bonding member 35, the second microlens 52, the base layer 36, and the second substrate 42. Furthermore, light from the organic layer 33 is emitted to the outside via the second electrode 32, the protective layer 34, the color filter layer CF, the first microlens 51, the flat portion 53, the second microlens 52, the base layer 36, and the second substrate 42.

In the light emitting element of Example 2, for example, the light beam emitted from the central portion O of the light emitting unit 30 and directed toward the vicinity of a peripheral portion 51A of the first microlens 51 is bent in a direction toward the optical axis of the first microlens 51 because the inequality of $n_1 > n_0$ is established at the interface between the first microlens 51 and the bonding member 35. Although depending on the shape of the first microlens 51, the light beam traveling toward the vicinity of the peripheral portion 51A of the first microlens 51 has a large incident angle with respect to the interface between the first microlens 51 and the bonding member 35 (the light exit surface (outer surface) of the first microlens 51), but is largely bent in the direction toward the optical axis of the first microlens 51 due to the refractive index difference between $n_1$ and $n_0$. Then, the light incident on a peripheral portion 52A of the second microlens 52 via the bonding member 35 is bent in a direction toward the optical axis of the second microlens 52 and finally emitted to the outside. Here, when the inequality of $r_2/r_1 > 1$ is satisfied, it is possible to suppress the light incident on the second microlens 52 from being excessively bent in the direction toward the optical axis of the second microlens 52. Furthermore, if the inequality of $$0.5 \leq S_0/S_{12} \leq 1.2$$

is satisfied, the front light extraction efficiency can be much further improved, and the front light extraction efficiency can be further improved by providing a black matrix layer BM as described later.

The display device of Example 2 can be manufactured on the basis of the following manufacturing method.

[Step-200]

The first substrate 41 above which a plurality of light emitting units 30 and a plurality of first microlenses 51 formed above the light emitting units 30 and having a convex shape in a direction away from the first substrate 41 are provided is prepared. Specifically, steps similar to [Step-100] to [Step-160] of Example 1 are executed.

[Step-210]

On the other hand, the second substrate 42 including the second microlens 52 having a convex shape in a direction away from the second substrate 42 is prepared. Specifically, a step similar to [Step-170] of Example 1 is executed.

[Step-220]

Then, the bonding member 35 is formed on the surface of the first substrate 41 on which the first microlens 51 is provided, the surface of the second substrate 42 on which the second microlens 52 is provided, or the surface of the first substrate 41 on which the first microlens 51 is provided and the surface of the second substrate 42 on which the second microlens 52 is provided. Specifically, for example, the bonding member 35 is applied.

[Step-230]

Next, the first substrate 41 and the second substrate 42 are disposed such that the first microlens 51 and the second microlens 52 face each other with the bonding member 35 interposed therebetween, and pressure is applied to the first substrate 41 and the second substrate 42, so that the top surface of the first microlens 51 and the top surface of the second microlens 52 are brought into contact with each other to form the flat portion 53. Specifically, for example, the flat portion 53 can be formed by placing the first substrate 41 on a fixed table, placing the second substrate 42 on an XYZ table, and moving the second substrate 42 in a Z-direction (that is, toward the first substrate 41). The alignment in this state is rough alignment. Note that the first microlens 51 and the second microlens 52 have flexibility to such an extent that the flat portion 53 can be formed.

[Step-240]

Thereafter, the first substrate 41 and the second substrate 42 are aligned. The alignment between the first substrate 41 and the second substrate 42 can be performed, for example, by detecting an alignment mark provided on the first substrate 41 and an alignment mark provided on the second substrate 42 using an appropriate device and slightly moving the second substrate 42 placed on the XYZ table in an XY-direction. The alignment in this state is fine alignment. Then, the first microlens 51 and the second microlens 52 are bonded to each other by the bonding member 35. The method for curing the bonding member 35 at the time of bonding is only required to be appropriately determined depending on the material constituting the bonding member 35. As described above, the display device of Example 2 can be obtained.

Figure 4:
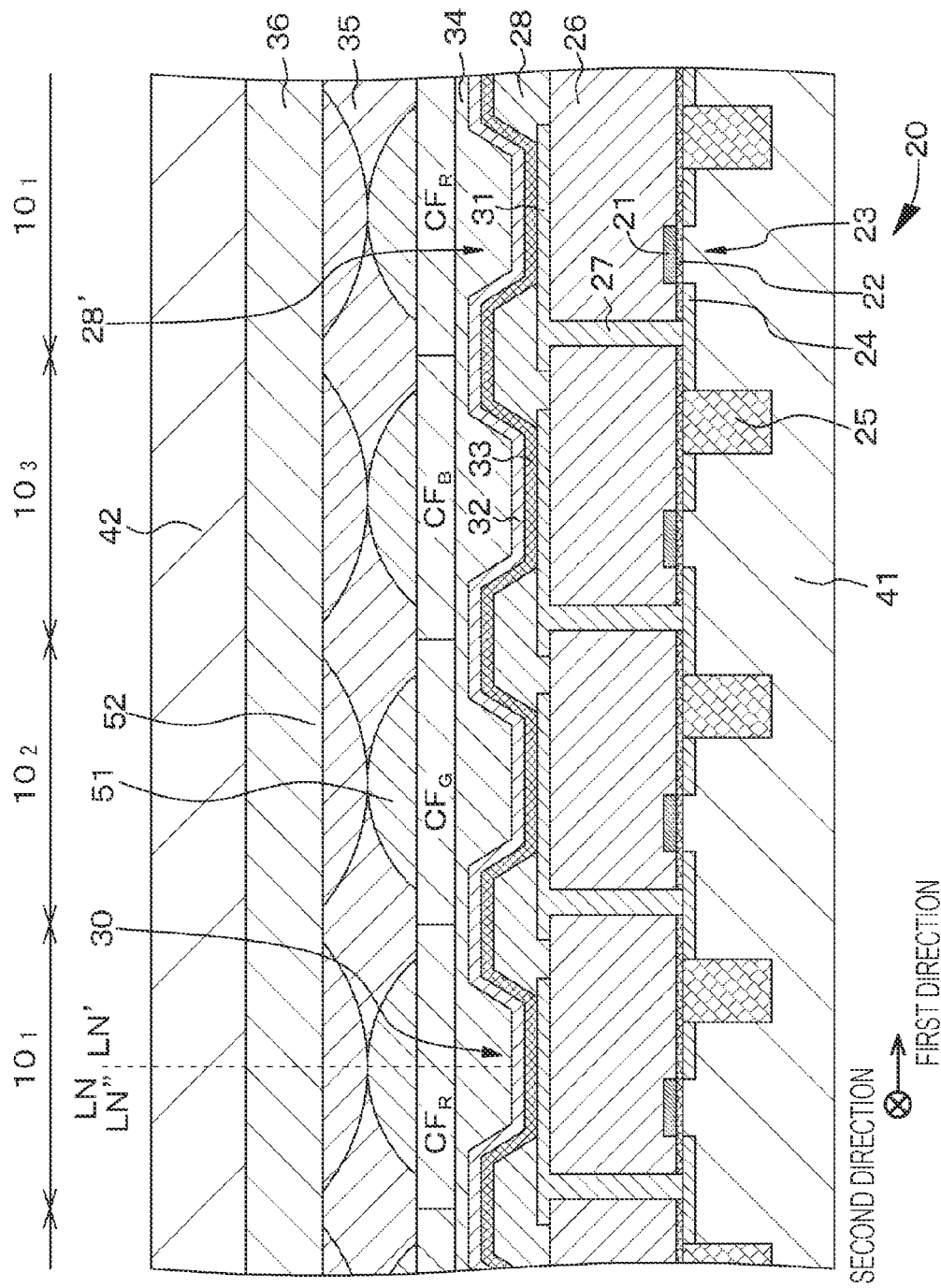
FIG. 4 is a schematic partial cross-sectional view of Modification Example-1 of the display device of Example 2.

Note that, as illustrated in a schematic partial cross-sectional view of Modification Example-1 of the display device of Example 2 in FIG. 4, the first microlens 51 and the second microlens 52 may be in contact with each other on the top surface without forming the flat portion 53.

Example 3

Figure 5:
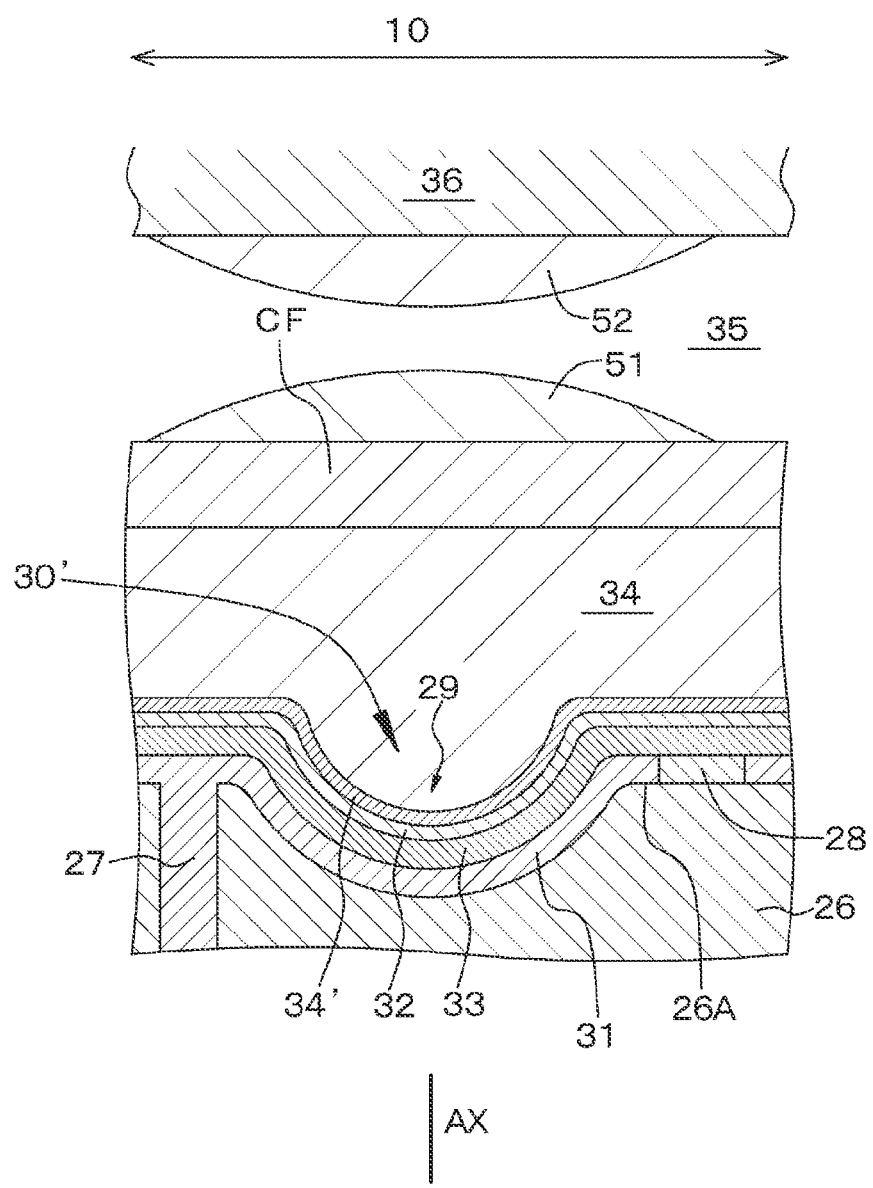
FIG. 5 is a schematic partial cross-sectional view of a light emitting element of Example 3.
Figure 6:
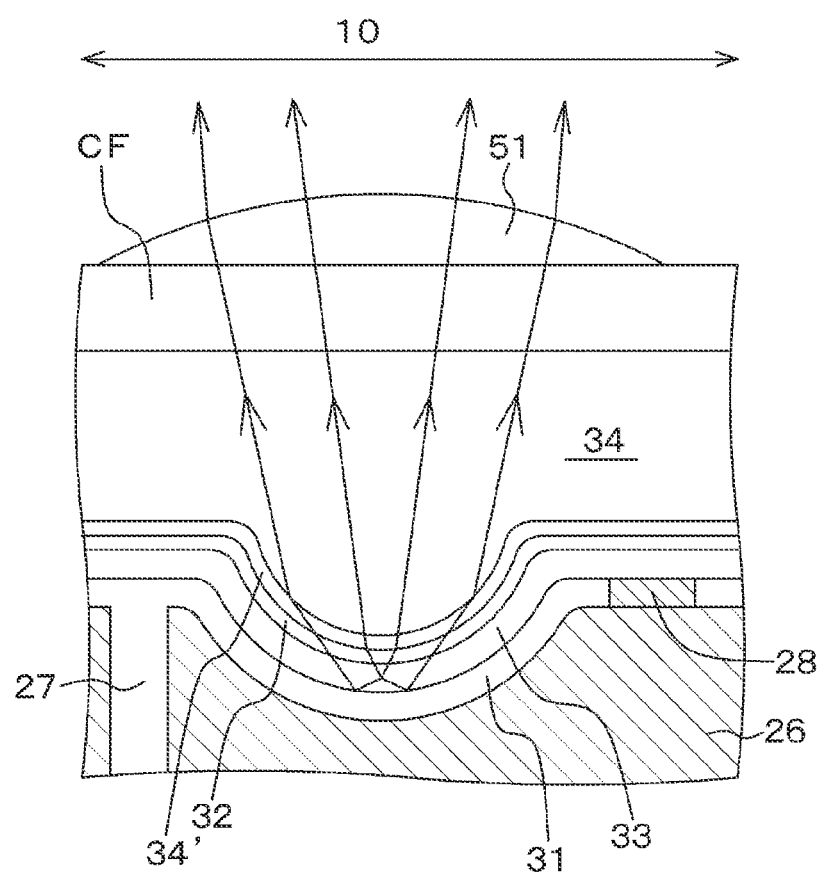
FIG. 6 is a schematic partial cross-sectional view of a light emitting element for illustrating behavior of light from the light emitting element of Example 3.

Example 3 is a modification of Examples 1 and 2. FIG. 5 illustrates a schematic partial cross-sectional view of a light emitting element of Example 3, and FIG. 6 illustrates a schematic partial cross-sectional view of the light emitting element for illustrating a behavior of light from the light emitting element of Example 3.

In the light emitting element 10 of Example 3, a light emitting unit 30' has a convex-shaped cross-sectional shape toward the first substrate 41.

Specifically,
- a concave portion 29 is provided on a surface 26A of the base substrate 26,
- at least a part of the first electrode 31 is formed so as to follow the shape of the top surface of the concave portion 29,
- at least a part of the organic layer 33 is formed on the first electrode 31 so as to follow the shape of the top surface of the first electrode 31,
- the second electrode 32 is formed on the organic layer 33 so as to follow the shape of the top surface of the organic layer 33, and
- the flattening layer 34 is formed on the second electrode 32.

In the light emitting element of Example 3, the entire first electrode 31 is formed in the concave portion 29 so as to follow the shape of the top surface of the concave portion 29, and the entire organic layer 33 is formed on the first electrode 31 so as to follow the shape of the top surface of the first electrode 31.

In the light emitting element 10 of Example 5, a protective film 34' is formed between the second electrode 32 and the flattening layer 34. The protective film 34' is formed so as to follow the shape of the top surface of the second electrode 32. Here, when the refractive index of the material constituting the flattening layer 34 is defined as $n_3$ and the refractive index of the material constituting the protective film 34' is defined as $n_4$, the inequality of $n_3 > n_4$ is satisfied. As the value of $(n_3 - n_4)$, 0.1 to 0.6 can be exemplified, but not limited thereto. Specifically, the material constituting the flattening layer 34 includes a material in which a refractive index is adjusted (increased) by adding $TiO_2$ to a base material including an acrylic resin, or a material in which a refractive index is adjusted (increased) by adding $TiO_2$ to a base material including the same type of material as the color resist material (however, a colorless transparent material to which a pigment is not added), and the material constituting the protective film 34' includes SiN, SiON, $Al_2O_3$, or $TiO_2$. Note that, for example, the following equations are established:

$$n_3 = 2.0 \text{ and}$$

$$n_4 = 1.6.$$

By forming such a protective film 34', as illustrated in FIG. 6, a part of the light emitted from the organic layer 33 passes through the second electrode 32 and the protective film 34' and enters the flattening layer 34, and a part of the light emitted from the organic layer 33 is reflected by the first electrode 31, passes through the second electrode 32 and the protective film 34' and enters the flattening layer 34. As a result of forming an internal lens by the protective film 34' and the flattening layer 34 in this manner, the light emitted from the organic layer 33 can be condensed in a direction toward the central portion side of the light emitting element.

Alternatively, in the light emitting element of Example 1, when an incident angle of light emitted from the organic layer 33 and incident on the flattening layer 34 through the second electrode 32 is defined as $\theta_i$, and a refraction angle of light incident on the flattening layer 34 is defined as $\theta_r$, in a case of $|\theta_r| \neq 0$, the following inequality is satisfied:

$$|\theta_\perp| > |\theta_r|.$$

By satisfying such a condition, a part of the light emitted from the organic layer 33 passes through the second electrode 32 and enters the flattening layer 34, and a part of the light emitted from the organic layer 33 is reflected by the first electrode 31, passes through the second electrode 32 and enters the flattening layer 34. As a result of forming the internal lens in this manner, the light emitted from the organic layer 33 can be condensed in the direction toward the central portion side of the light emitting element.

As described above, by forming the concave portion, the front light extraction efficiency can be much further improved as compared with a case where the first electrode, the organic layer, and the second electrode have a flat laminated structure.

Figure 24A:
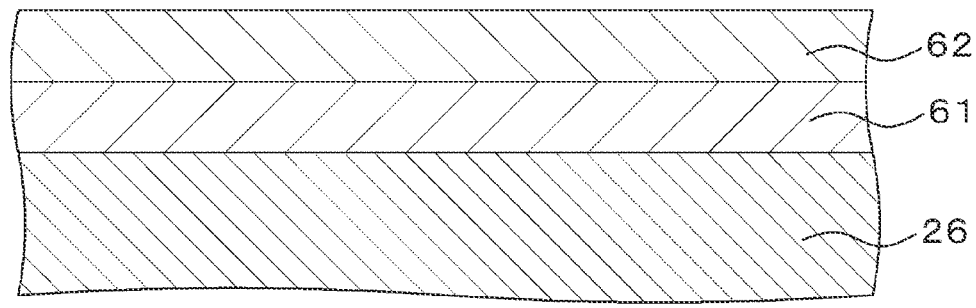
FIGS. 24A, 24B, and 24C are schematic partial end views of a base substrate and the like for illustrating a method for manufacturing the light emitting element of Example 3 illustrated in FIG. 5.
Figure 24B:
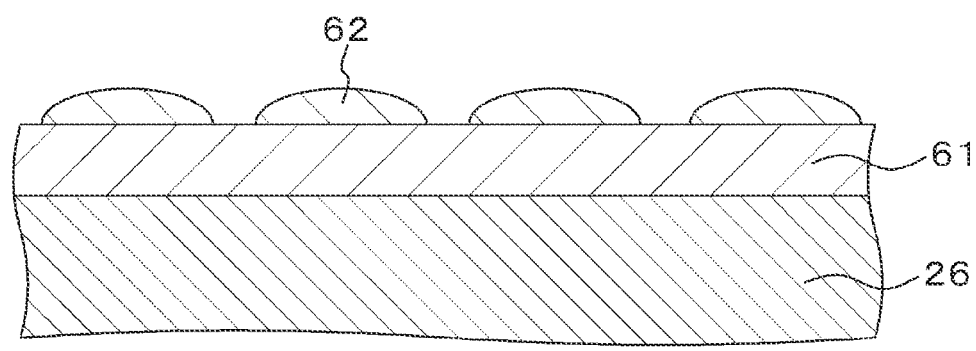
Figure 24C:
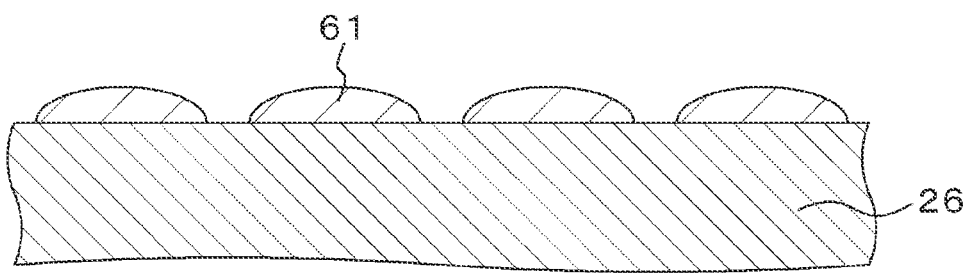
Figure 25A:
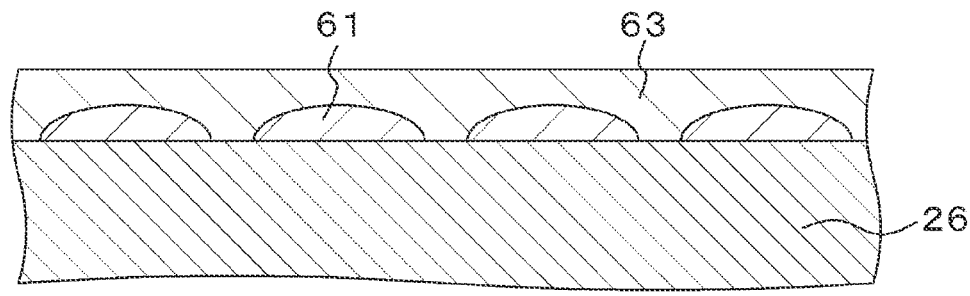
FIGS. 25A and 25B are schematic partial end views of a base substrate and the like for illustrating the method for manufacturing the light emitting element of Example 3 illustrated in FIG. 5, following FIG. 24C.
Figure 25B:
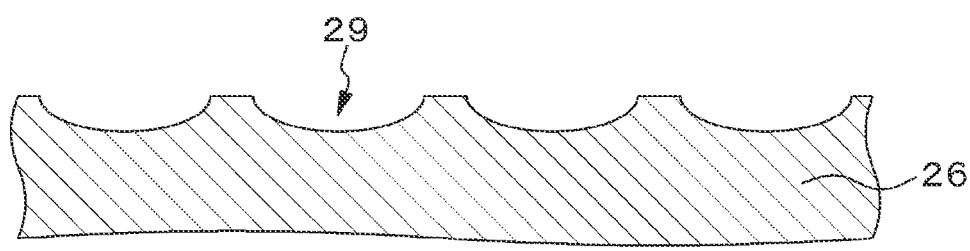

In order to form the concave portion 29 in the portion of the base substrate 26 where the light emitting element is to be formed, specifically, a mask layer 61 including SiN is formed on the base substrate 26 including $SiO_2$, and a resist layer 62 to which a shape for forming the concave portion is imparted is formed on the mask layer 61 (see FIGS. 24A and 24B). Then, by etching back the resist layer 62 and the mask layer 61, the shape formed on the resist layer 62 is transferred to the mask layer 61 (see FIG. 24C). Next, after the resist layer 63 is formed on the entire surface (see FIG. 25A), the resist layer 63, the mask layer 61, and the base substrate 26 are etched back, so that the concave portion 29 can be formed in the base substrate 26 (see FIG. 25B). By appropriately selecting the material of the resist layer 63 and appropriately setting the etching conditions for etching back the resist layer 63, the mask layer 61, and the base substrate 26, specifically, by selecting a material system and an etching condition in which the etching speed of the resist layer 63 is lower than the etching speed of the mask layer 61, the concave portion 29 can be formed in the base substrate 26.

Figure 26A:
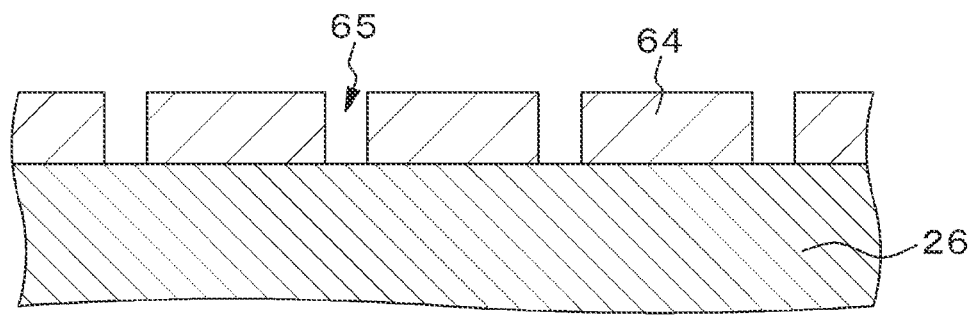
FIGS. 26A and 26B are schematic partial end views of a base substrate and the like for illustrating another method for manufacturing the light emitting element of Example 3 illustrated in in FIG. 5.
Figure 26B:
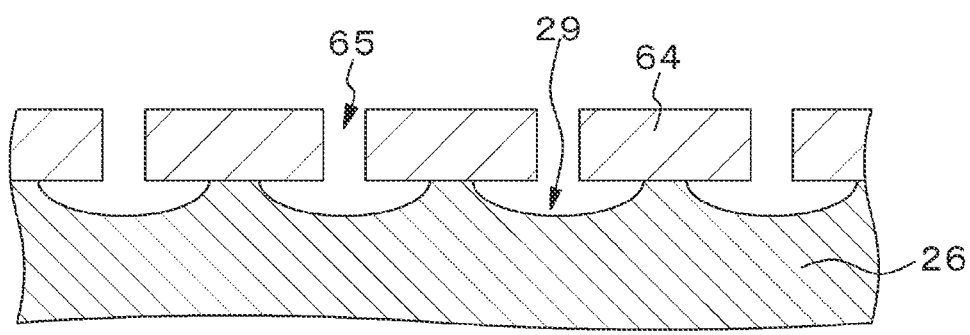

Alternatively, the resist layer 64 having an opening section 65 is formed on the base substrate 26 (see FIG. 26A). Then, the concave portion 29 can be formed in the base substrate 26 by wet etching the base substrate 26 through the opening section 65 (see FIG. 26B).

Furthermore, the protective film 34' is only required to be formed on the entire surface on the basis of, for example, an ALD method. The protective film 34' is formed on the second electrode 32 so as to follow the shape of the top surface of the second electrode 32, and has the same thickness in the concave portion 29. Next, after the flattening layer 34 is formed on the entire surface on the basis of a coating method, the top surface of the flattening layer 34 is only required to be flattened.

As described above, in the light emitting element of Example 3, the concave portion is provided on the surface of the base substrate, and the first electrode, the organic layer, and the second electrode are formed so as to substantially follow the shape of the top surface of the concave portion. Then, since the concave portion is formed in this manner, the concave portion can function as a kind of concave mirror. As a result, it is possible to further improve the front light extraction efficiency, current-light emission efficiency is remarkably improved, and the manufacturing step is not significantly increased. Furthermore, since the organic layer has a constant thickness, the resonator structure can be easily formed. Furthermore, since the thickness of the first electrode is constant, it is possible to suppress the occurrence of a phenomenon such as coloring or luminance change of the first electrode depending on the angle at which the display device is viewed due to the thickness change of the first electrode.

Note that, since the region other than the concave portion 29 is also configured by the laminated structure of the first electrode 32, the organic layer 33, and the second electrode 32, light is emitted also from this region. This may cause a decrease in light condensing efficiency and a decrease in monochromaticity due to light leakage from adjacent pixels. Here, since the boundary between the insulating layer 28 and the first electrode 31 is a light emitting area end, it is only required to optimize the region where light is emitted by optimizing this boundary.

In particular, in a microdisplay having a small pixel pitch, high front light extraction efficiency can be achieved even when an organic layer is formed in a concave portion by reducing the depth of the concave portion, and thus the microdisplay is suitable for application to future mobile applications. In the simulation result of the light emitting element of Example 3, the current-light emission efficiency is improved by 3.5 times as compared with the conventional light emitting element, and it is possible to realize longer life and higher luminance of the light emitting element and the display device. Furthermore, applications to eyewear, augmented reality (AR) glasses, and EVR are remarkably expanded.

As the depth of the concave portion is deeper, the light emitted from the organic layer and reflected by the first electrode can be condensed in a direction toward the central portion side of the light emitting element. However, in a case where the depth of the concave portion is large, it may be difficult to form the organic layer in the upper portion of the concave portion. However, since the internal lens is formed by the protective film and the flattening layer, the light reflected by the first electrode can be condensed in the direction toward the central portion side of the light emitting element even if the depth of the concave portion is shallow, and the front light extraction efficiency can be further improved. Moreover, since the internal lens is formed in a self-alignment manner (self-alignment) with respect to the organic layer, there is no misalignment between the organic layer and the internal lens. Furthermore, since the angle of the light passing through the color filter layer with respect to the base substrate virtual plane can be increased by forming the concave portion and the internal lens, the occurrence of color mixing between adjacent pixels can be effectively prevented. Then, as a result, a color gamut reduction caused by the optical color mixture between the adjacent pixels is improved, so that the color gamut of the display device can be improved. Furthermore, in general, the closer the organic layer and the lens are, the more efficiently the light can be spread to a wide angle. However, since the distance between the internal lens and the organic layer is very short, the design width and the design flexibility of the light emitting element are widened. Moreover, by appropriately selecting the thickness and the material of the protective film, the distance between the internal lens and the organic layer and the curvature of the internal lens can be changed, and the design width and the design flexibility of the light emitting element are further widened. Furthermore, since heat treatment is unnecessary for forming the internal lens, the organic layer is not damaged.

Figure 7A:
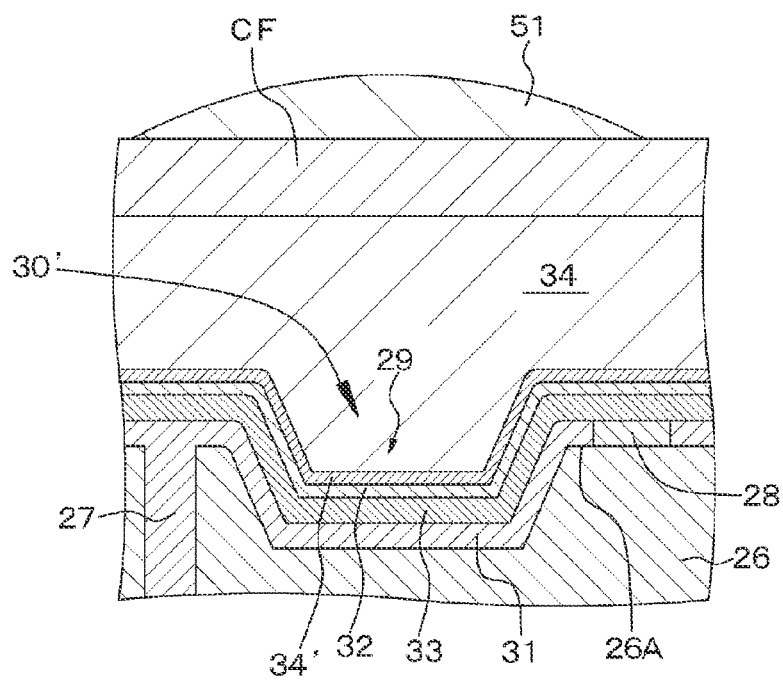
FIGS. 7A and 7B are schematic partial end views of modification examples of the light emitting element of Example 3.
Figure 7B:
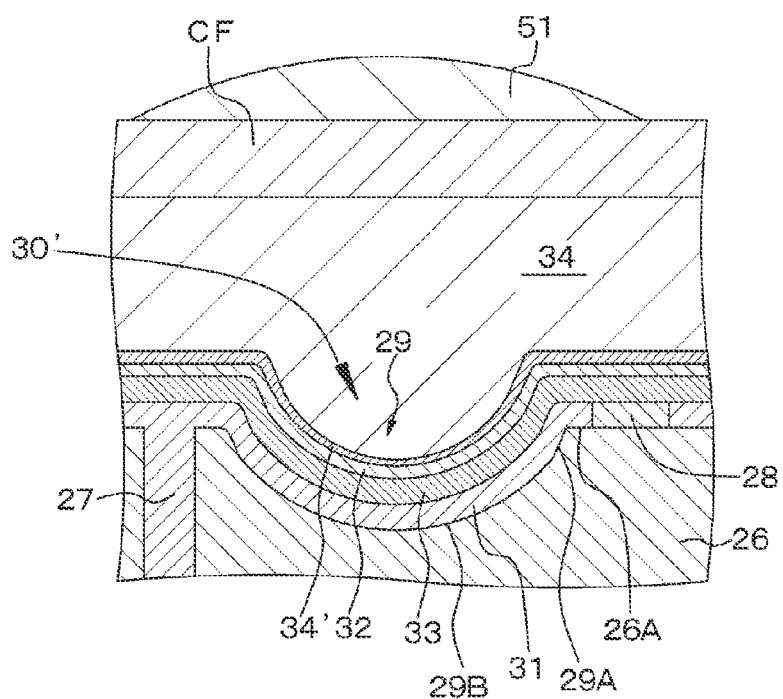

In the example illustrated in FIG. 5, the cross-sectional shape of the concave portion 29 when the concave portion 29 is cut by the virtual plane including an axis AX of the concave portion 29 is a smooth curve. However, as illustrated in FIG. 7A, the cross-sectional shape may be a part of a trapezoid, or as illustrated in FIG. 7B, a combination of a linear inclined surface 29A and a bottom portion 29B including a smooth curve may be used. Note that, in FIGS. 7A and 7B, the second microlens 52 and the base layer 36 are not illustrated. By forming the cross-sectional shape of the concave portion 29 into these shapes, the inclination angle of the inclined surface 29A can be increased. As a result, even if the depth of the concave portion 29 is shallow, the light emitted from the organic layer 33 and reflected by the first electrode 31 can be improved in extraction in the front direction.

Example 4

Figure 8:
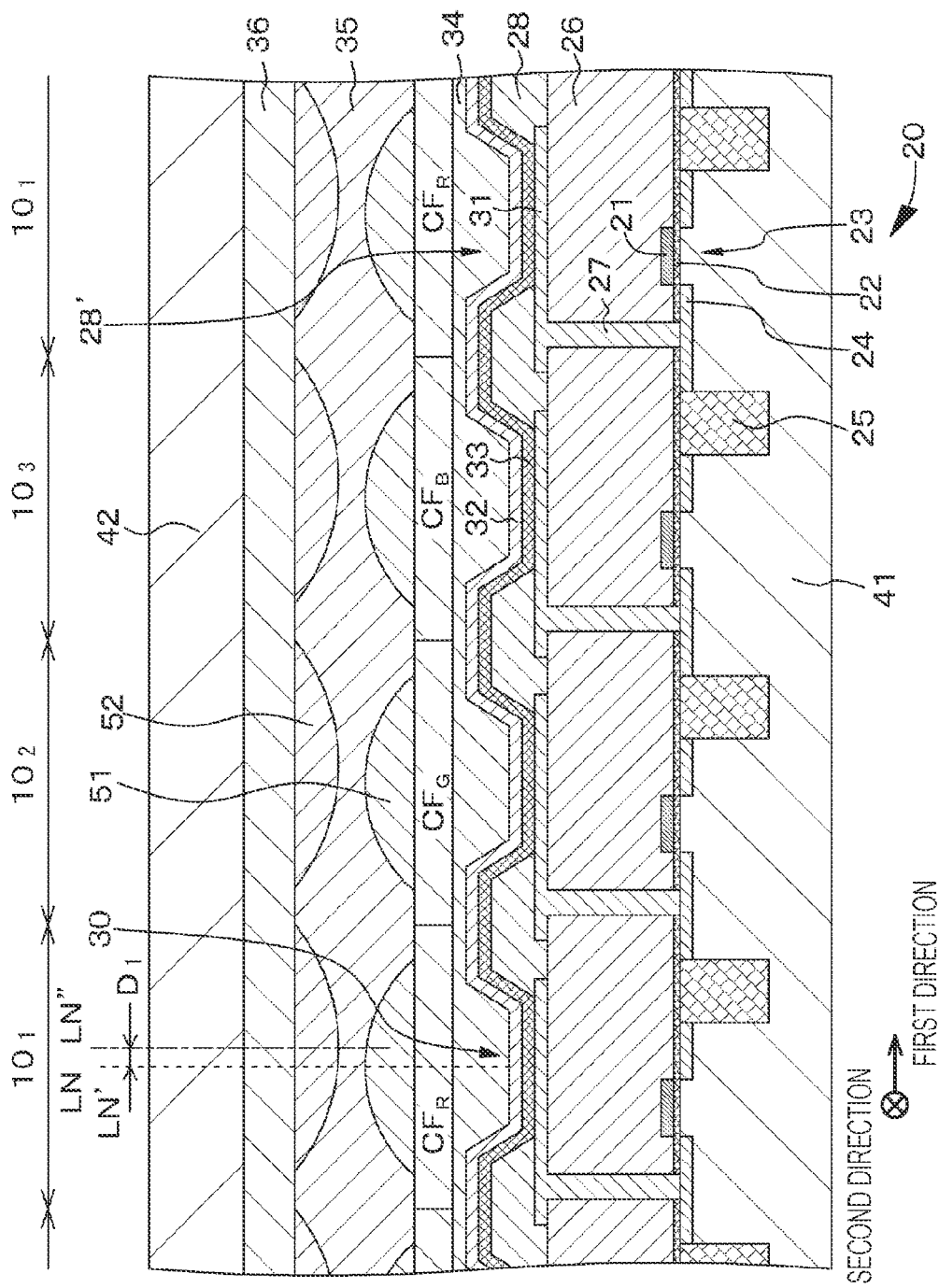
FIG. 8 is a schematic partial cross-sectional view of a display device of Example 4.
Figure 9:
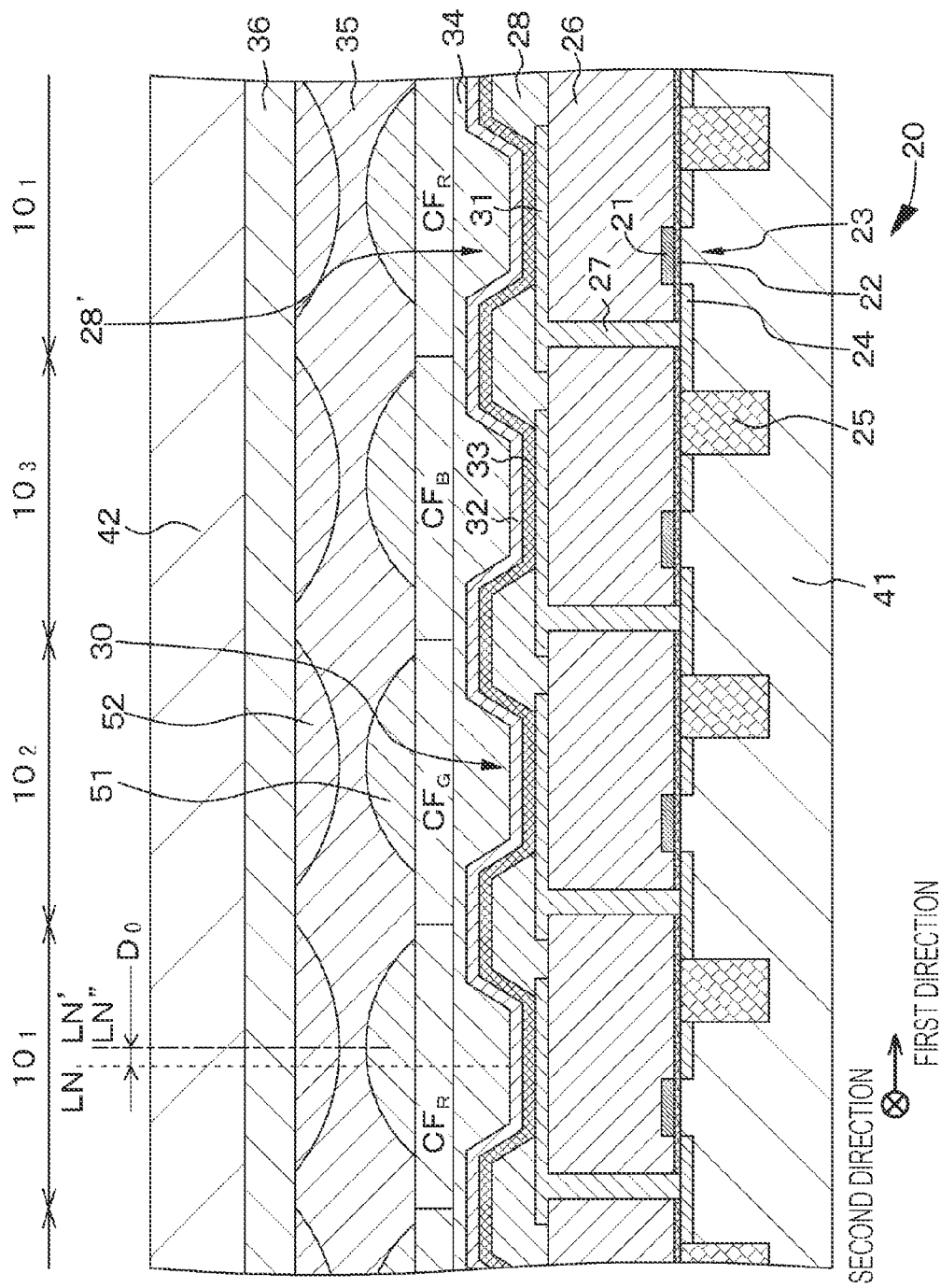
FIG. 9 is a schematic partial cross-sectional view of Modification Example-1 of the display device of Example 4.
Figure 10:
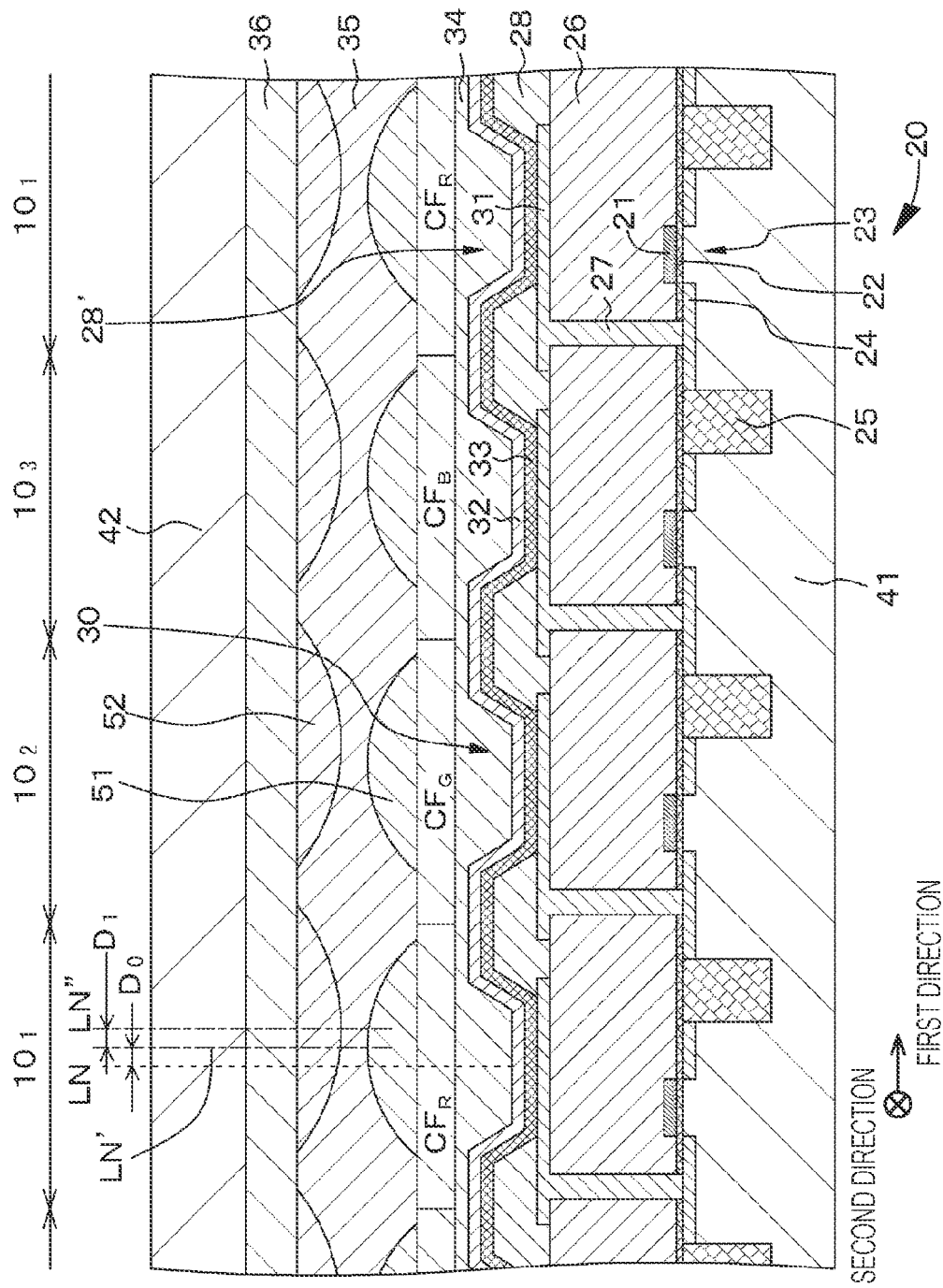
FIG. 10 is a schematic partial cross-sectional view of Modification Example-2 of the display device of Example 4.

Example 4 is a modification of Examples 1 to 3. FIGS. 8, 9, and 10 illustrate schematic partial cross-sectional views of a display device of Example 4 as a modification example of Example 1, and an arrangement relationship among the light emitting unit 30, the first microlens 51, and the second microlens 52 is as follows.

That is, as illustrated in FIG. 8, the optical axis LN' of the first microlens 51 does not coincide with the optical axis LN" of the second microlens 52, and the optical axis LN' of the first microlens 51 passes through the center LN of the light emitting region. A deviation amount between the optical axis LN' and the optical axis LN" is represented by $D_1$.

Alternatively, as illustrated in FIG. 9, the optical axis LN' of the first microlens 51 and the optical axis LN" of the second microlens 52 coincide with each other, and do not pass through the center LN of the light emitting region. A deviation amount between the optical axes LN' and LN" and the center LN of the light emitting region is represented by $D_0$.

Alternatively, as illustrated in FIG. 10, the optical axis LN' of the first microlens 51 and the optical axis LN' of the second microlens 52 do not match, the optical axis LN' of the first microlens 51 does not pass through the center LN of the light emitting region, and the optical axis LN" of the second microlens 52 does not pass through the center LN of the light emitting region. A deviation amount between the optical axis LN' and the center LN of the light emitting region is represented by $D_0$, and a deviation amount between the optical axis LN' and the optical axis LN" is represented by $D_1$.

By adopting the arrangement relationship among the light emitting unit 30 and the first microlens 51 the second microlens 52, it is possible to control the direction of the light emitted from the light emitting element. When the configuration of Example 4 is adopted in the light emitting element positioned in a region away from the central region of the display device, images can be collected above the central region of the display device. The values of $D_0$ and $D_1$ may be increased as the distance from the center region of the display device increases. The center point of the wavelength selection means (color filter layer CF) may pass through the center LN of the light emitting region, or may not pass through the center of the light emitting region. In the latter case, it is desirable that the distance from the center of the light emitting region to the center point of the wavelength selection means be also set to a larger value as the light emitting element is positioned in the peripheral portion of the display device.

Example 5

Figure 11:
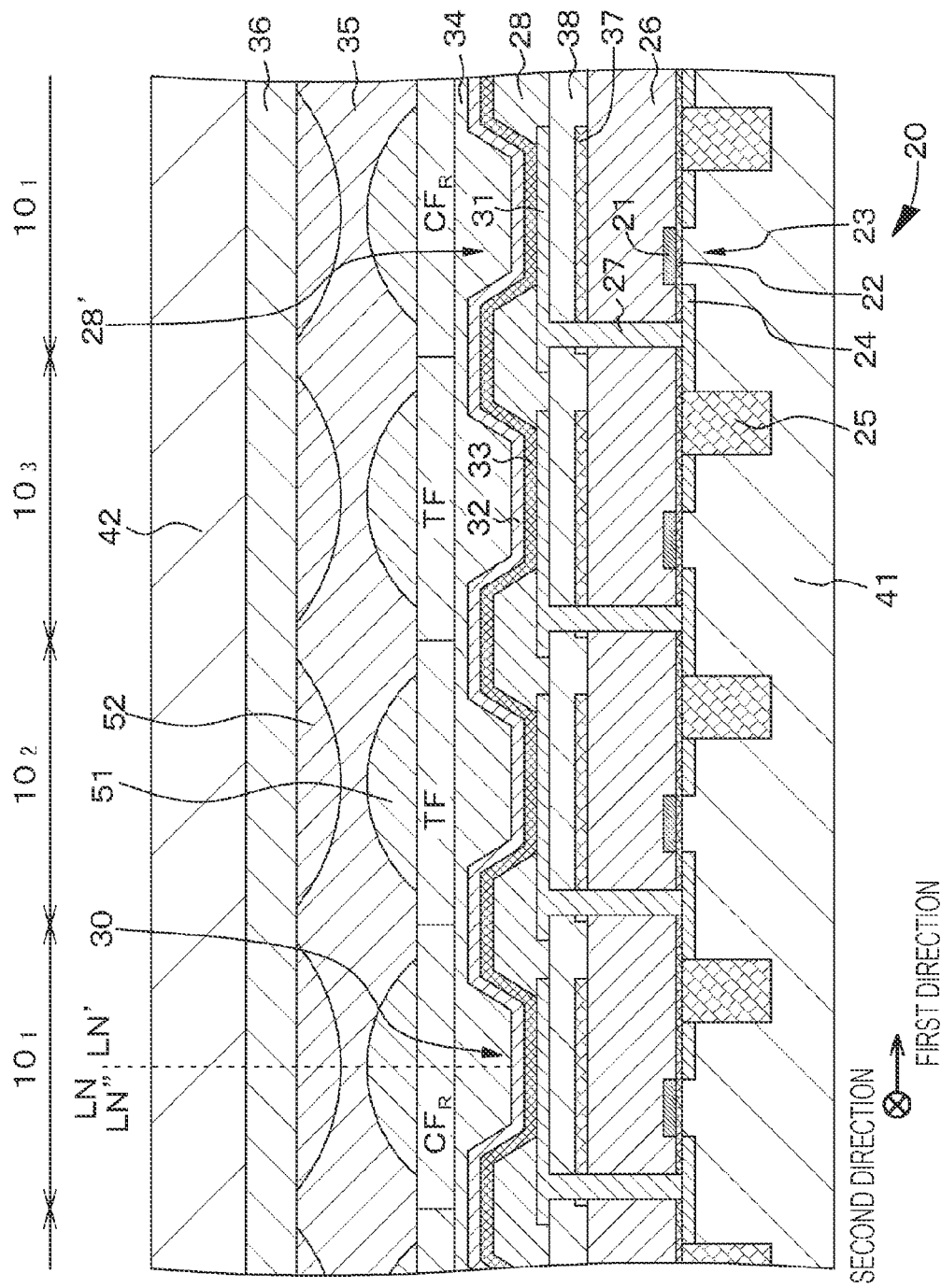
FIG. 11 is a schematic partial cross-sectional view of a display device of Example 5 (including a schematic partial cross-sectional view of the light emitting element of Example 1).

Example 5 is a modification of Examples 1 to 4. A light emitting element of Example 5 has a resonator structure. That is, a display device of Example 5 is the display device of the first aspect. FIG. 11 illustrates a schematic partial cross-sectional view of the display device of Example 5 (including a schematic partial cross-sectional view of the light emitting element of Example 1).

That is, in the display device of Example 1, each light emitting element 10 has a resonator structure, the first light emitting element $10_1$ emits red light, the second light emitting element $10_2$ emits green light, and the third light emitting element $10_3$ emits blue light, the first light emitting element $10_1$ is provided with wavelength selection means that allows the emitted red light to pass therethrough, and the second light emitting element $10_2$ and the third light emitting element $10_3$ are not provided with the wavelength selection means.

Alternatively, there are provided a first substrate 41 and a second substrate 42, and a plurality of light emitting element units each including a first light emitting element $10_1$, a second light emitting element $10_2$, and a third light emitting element $10_2$ provided on the first substrate 41, in which each light emitting element 10 includes a light emitting unit 30 provided above the first substrate 41, each light emitting element 10 has a resonator structure, the first light emitting element $10_1$ emits red light, the second light emitting element $10_2$ emits green light, and the third light emitting element $10_3$ emits blue light, the first light emitting element $10_1$ is provided with wavelength selection means that allows the emitted red light to pass therethrough, and the wavelength selection means is not provided in the second light emitting element $10_2$ and the third light emitting element $10_3$.

Here, examples of the wavelength selection means that allows the emitted red light to pass therethrough include the red color filter layer $CF_R$, but are not limited thereto. Furthermore, in the second light emitting element $10_2$ and the third light emitting element $10_3$, a transparent filter layer TF is provided instead of the color filter layer.

Optimum $OL_1$ and $OL_2$ may be obtained in each of the first light emitting element $10_1$ for displaying red, the second light emitting element $10_2$ for displaying green, and the third light emitting element $10_3$ for displaying blue on the basis of Inequalities (1-1) and (1-2) as described above, whereby an emission spectrum having a sharp peak can be obtained in each light emitting element. The first light emitting element $10_1$, the second light emitting element $10_2$, and the third light emitting element $10_3$ have the same configuration and structure except for the color filter layers $CF_R$, $CF_G$, and $CF_B$ and the resonator structure (the configuration of the light emitting layer).

Incidentally, depending on the settings of $m_1$ and $m_2$, light having a wavelength $\lambda_R'$ shorter than that of $\Delta_R$ may resonate in the resonator in addition to the maximum peak wavelength $\lambda_R$ (red) of the spectrum of light generated in the light emitting layer provided in the first light emitting element $10_1$ for displaying red. Similarly, light having a wavelength $\lambda_G'$ shorter than that of $\lambda_G$ may resonate in the resonator in addition to the maximum peak wavelength $\lambda_G$ (green) of the spectrum of light generated in the light emitting layer provided in the second light emitting element $10_2$ for displaying green. Furthermore, light having a wavelength $\lambda_B'$ shorter than that of $\lambda_B$ may resonate in the resonator in addition to the maximum peak wavelength $\lambda_B$ (blue) of the spectrum of light generated in the light emitting layer provided in the third light emitting element $10_3$ for displaying blue. Usually, the light having the wavelengths $\lambda_G'$ and $\lambda_B'$ is out of the range of visible light, and thus is not observed by the observer of the display device. However, the light having the wavelength $\Delta_R'$ may be observed as blue by the observer of the display device.

Therefore, in such a case, it is not necessary to provide the wavelength selection means in the second light emitting element $10_2$ and the third light emitting element $10_3$. However, it is preferable to provide the wavelength selection means that allows the emitted red light to pass therethrough in the first light emitting element $10_1$. Then, as a result, an image with high color purity can be displayed by the first light emitting element $10_1$, and the wavelength selection means is not provided in the second light emitting element $10_2$ and the third light emitting element $10_3$, so that high light emission efficiency can be achieved in the second light emitting element $10_2$ and the third light emitting element $10_3$.

Specifically, the resonator structure is only required to include a material that reflects light with high efficiency as described above as a material constituting the first electrode 31. Furthermore, in a case where a light reflecting layer 37 is provided below the first electrode 31 (on the first substrate 41 side), the material constituting the first electrode 31 is only required to include a transparent conductive material as described above. In a case where the light reflecting layer 37 is provided on the base substrate 26 and the first electrode 31 is provided on an interlayer insulating layer 38 covering the light reflecting layer 37, the light reflecting layer 37 and the interlayer insulating layer 38 are only required to include the above-described material. The light reflecting layer 37 may or may not be connected to the contact hole (contact plug) 27 (see FIG. 11).

Figure 14A:
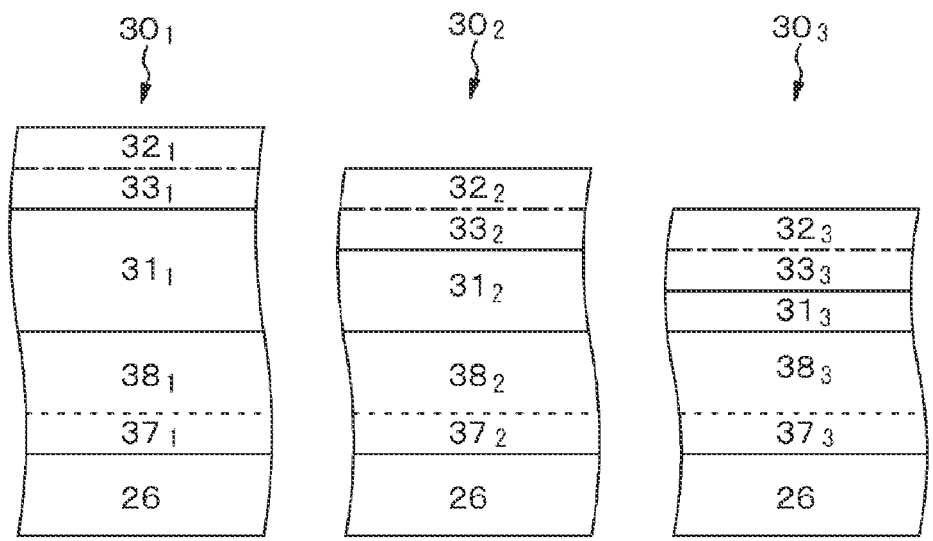
FIGS. 14A and 14B are conceptual diagrams of a light emitting element having a fifth example and a sixth example of the resonator structure in Example 5.
Figure 14B:
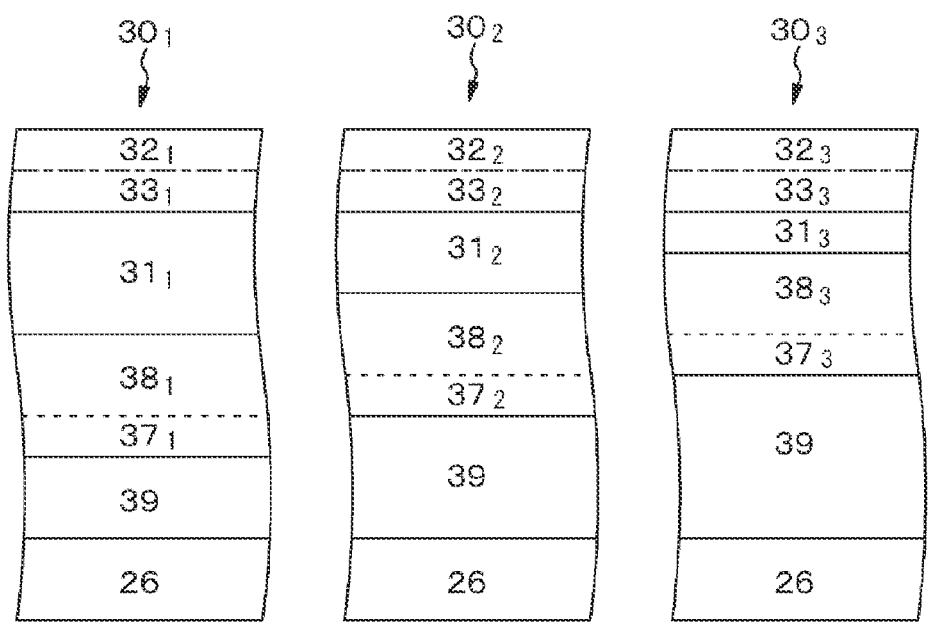
Figure 15A:
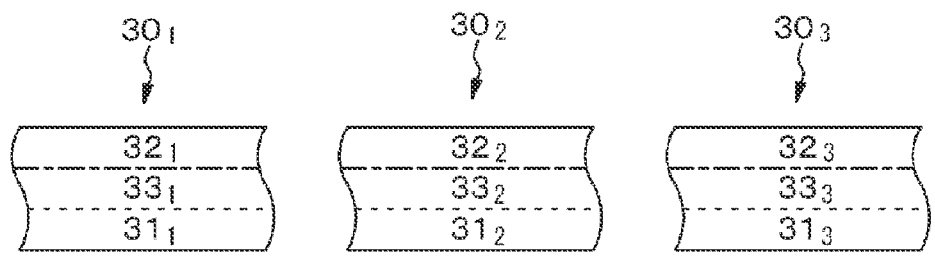
FIG. 15A is a conceptual diagram of a light emitting element having a seventh example of the resonator structure in Example 5.
Figure 15B:
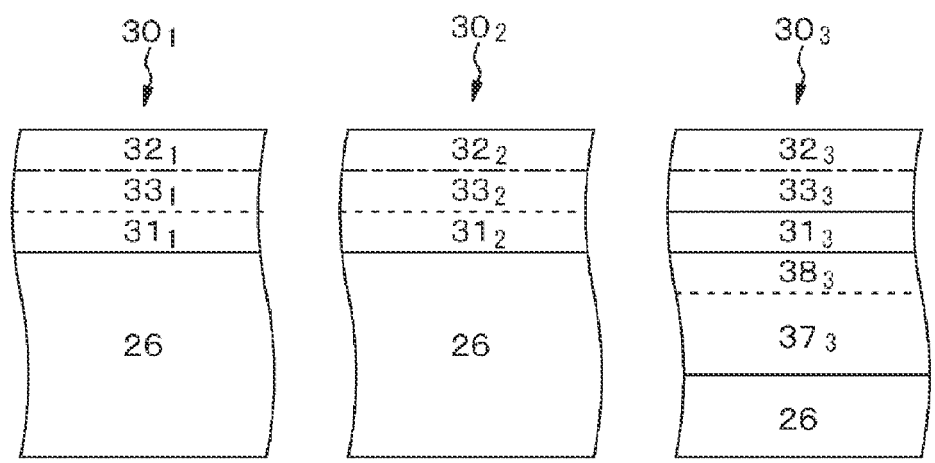
FIGS. 15B and 15C are conceptual diagrams of a light emitting element having an eighth example of the resonator structure in Example 5.
Figure 15C:
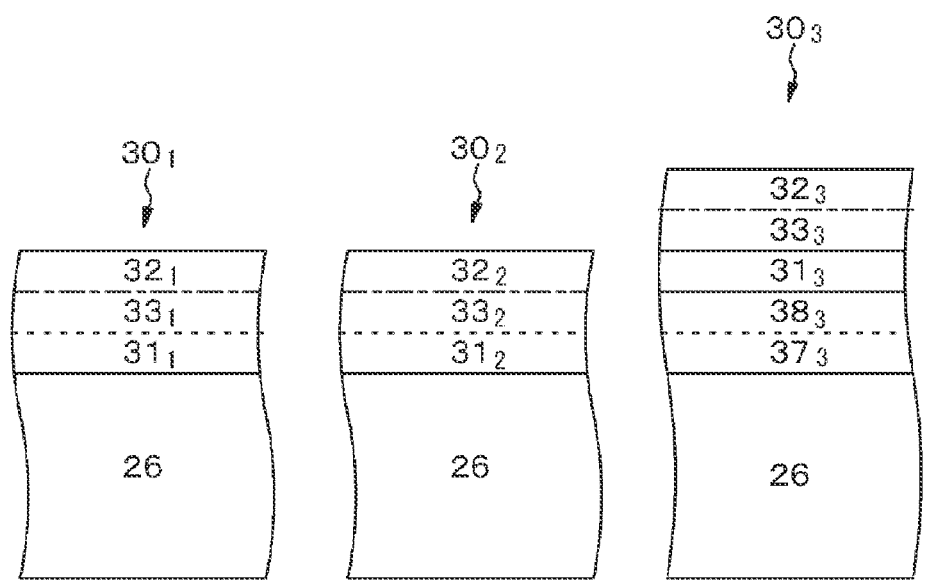

Hereinafter, the resonator structure will be described on the basis of a first example to an eight example with reference to FIG. 12A (the first example), FIG. 12B (the second example), FIG. 13A (the third example), FIG. 13B (the fourth example), FIG. 14A (the fifth example), FIG. 14B (the sixth example), FIG. 15A (the seventh example), and FIGS. 15B and 15C (the eight example). Here, in the first to fourth examples and the seventh example, the first electrode and the second electrode have the same thickness in each light emitting unit. On the other hand, in the fifth and sixth examples, the first electrode has a different thickness in each light emitting unit, and the second electrode has the same thickness in each light emitting unit. Furthermore, in the eighth example, the first electrode may have a different thickness or may have the same thickness in each light emitting unit, and the second electrode has the same thickness in each light emitting unit.

Note that, in the following description, the light emitting units constituting the first light emitting element $10_1$, the second light emitting element $10_2$, and the third light emitting element $10_3$ are denoted by reference numerals $30_1$, $30_2$, and $30_3$, the first electrodes are denoted by reference numerals $31_1$, $31_2$, and $31_3$, the second electrodes are denoted by reference numerals $32_1$, $32_2$, and $32_3$, the organic layers are denoted by reference numerals $33_1$, $33_2$, and $33_3$, the light reflecting layers are denoted by reference numerals $37_1$, $37_2$, and $37_3$, and the interlayer insulating layers are denoted by reference numerals $38_1$, $38_2$, $38_3$, $38_1'$, $38_2'$, and $38_3'$. In the following description, materials to be used are examples, and can be changed as appropriate.

In the illustrated example, the resonator lengths of the first light emitting element $10_1$, the second light emitting element $10_2$, and the third light emitting element $10_3$ derived from Inequalities (1-1) and (1-2) are shortened in the order of the first light emitting element $10_1$, the second light emitting element $10_2$, and the third light emitting element $10_3$, but the present disclosure is not limited thereto, and the optimum resonator length is only required to be determined by appropriately setting the values of $m_1$ and $m_2$.

Figure 12A:
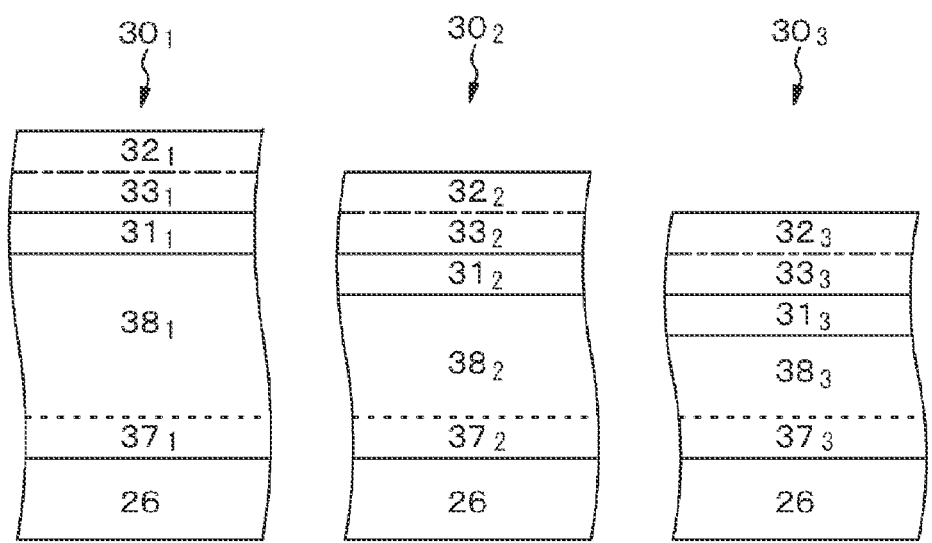
FIGS. 12A and 12B are conceptual diagrams of a light emitting element having a first example and a second example of a resonator structure in Example 5.
Figure 12B:
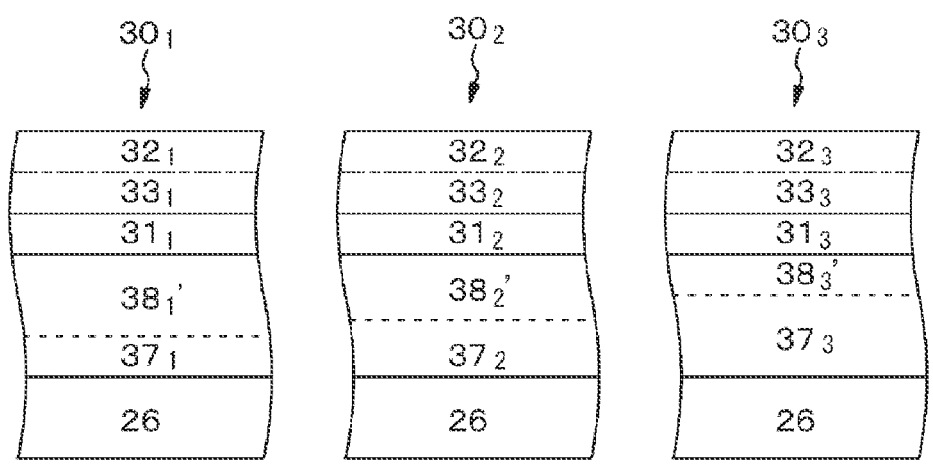
Figure 13A:
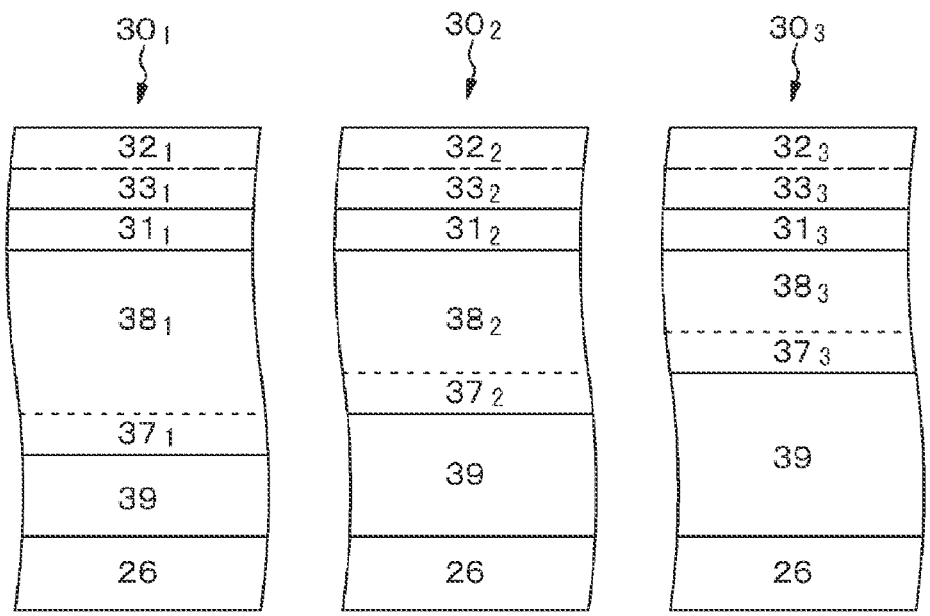
FIGS. 13A and 13B are conceptual diagrams of a light emitting element having a third example and a fourth example of the resonator structure in Example 5.
Figure 13B:
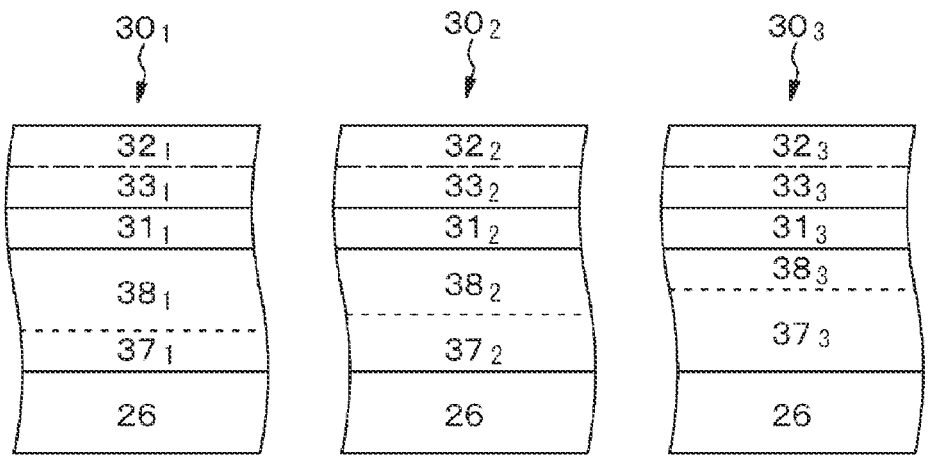

FIG. 12A illustrates a conceptual diagram of the light emitting element having the first example of the resonator structure, FIG. 12B illustrates a conceptual diagram of the light emitting element having the second example of the resonator structure, FIG. 13A illustrates a conceptual diagram of the light emitting element having the third example of the resonator structure, and FIG. 13B illustrates a conceptual diagram of the light emitting element having the fourth example of the resonator structure. In some of the first to sixth examples and the eighth example, the interlayer insulating layers 38 and 38' are formed under the first electrode 31 of the light emitting unit 30, and the light reflecting layer 37 is formed under the interlayer insulating layers 38 and 38'. In the first example to the fourth example, the thicknesses of the interlayer insulating layers 38 and 38' are different in the light emitting units $30_1$, $30_2$, and $30_3$. Then, by appropriately setting the thicknesses of the interlayer insulating layers $38_1$, $38_2$, $38_3$, $38_1'$, $38_2'$, and $38_3'$, it is possible to set an optical distance at which optimum resonance is generated with respect to the emission wavelength of the light emitting unit 30.

In the first example, in the light emitting units $30_1$, $30_2$, and $30_3$, the first interface (in the drawings, it is indicated by a dotted line) is set to the same level, while the level of the second interface (in the drawings, it is indicated by an alternate long and short dash line) is different in the light emitting units $30_1$, $30_2$, and $30_3$. Furthermore, in the second example, the first interface is set to a different level in the light emitting units $30_1$, $30_2$, and $30_3$, while the level of the second interface is the same in the light emitting units $30_1$, $30_2$, and $30_3$.

In the second example, the interlayer insulating layers $38_1'$, $38_2'$, and $38_3'$ include an oxide film in which the surface of the light reflecting layer 37 is oxidized. The interlayer insulating layer 38' including an oxide film includes, for example, aluminum oxide, tantalum oxide, titanium oxide, magnesium oxide, zirconium oxide, or the like depending on the material constituting the light reflecting layer 37. The surface of the light reflecting layer 37 can be oxidized by, for example, the following method. That is, the first substrate 41 on which the light reflecting layer 37 is formed is immersed in the electrolytic solution filled in a container. Furthermore, a cathode is disposed so as to face the light reflecting layer 37. Then, the light reflecting layer 37 is anodized using the light reflecting layer 37 as an anode. The film thickness of the oxide film due to the anodization is proportional to a potential difference between the light reflecting layer 37 as an anode and the cathode. Therefore, anodization is performed in a state where a voltage corresponding to the light emitting units $30_1$, $30_2$, and $30_3$ is applied to each of the light reflecting layers $37_1$, $37_2$, and $37_3$. As a result, the interlayer insulating layers $38_1'$, $38_2'$, and $38_3'$ including oxide films having different thicknesses can be collectively formed on the surface of the light reflecting layer 37. The thicknesses of the light reflecting layers $37_1$, $37_2$, and $37_3$ and the thicknesses of the interlayer insulating layers $38_1'$, $38_2'$, and $38_3'$ differ depending on the light emitting units $30_1$, $30_2$, and $30_3$.

In the third example, a base film 39 is disposed under the light reflecting layer 37, and the base film 39 has different thicknesses in the light emitting units $30_1$, $30_2$, and $30_3$. That is, in the illustrated example, the thickness of the base film 39 is larger in the order of the light emitting unit $30_1$, the light emitting unit $30_2$, and the light emitting unit $30_3$.

In the fourth example, the thicknesses of the light reflecting layers $37_1$, $37_2$, and $37_3$ at the time of film formation are different in the light emitting units $30_1$, $30_2$, and $30_3$. In the third and fourth examples, the second interface is set to the same level in the light emitting units $30_1$, $30_2$, and $30_3$, while the level of the first interface is different in the light emitting units $30_1$, $30_2$, and $30_3$.

In the fifth and sixth examples, the thicknesses of the first electrodes $31_1$, $31_2$, and $31_3$ are different in the light emitting units $30_1$, $30_2$, and $30_3$. The light reflecting layer 37 has the same thickness in each light emitting unit 30.

In the fifth example, the level of the first interface is the same in the light emitting units $30_1$, $30_2$, and $30_3$, while the level of the second interface is different in the light emitting units $30_1$, $30_2$, and $30_3$.

In the sixth example, the base film 39 is disposed under the light reflecting layer 37, and the base film 39 has different thicknesses in the light emitting units $30_1$, $30_2$, and $30_3$. That is, in the illustrated example, the thickness of the base film 39 is larger in the order of the light emitting unit $30_1$, the light emitting unit $30_2$, and the light emitting unit $30_3$. In the sixth example, the second interface is set to the same level in the light emitting units $30_1$, $30_2$, and $30_3$, while the level of the first interface is different in the light emitting units $30_1$, $30_2$, and $30_3$.

In the seventh example, the first electrodes $31_1$, $31_2$, and $31_3$ also serve as a light reflecting layer, and the optical constant (specifically, the phase shift amount) of the material constituting the first electrodes $31_1$, $31_2$, and $31_3$ varies depending on the light emitting units $30_1$, $30_2$, and $30_3$. For example, the first electrode $31_1$ of the light emitting unit $30_1$ may include copper (Cu), and the first electrode $31_2$ of the light emitting unit $30_2$ and the first electrode $31_3$ of the light emitting unit $30_3$ are only required to include aluminum (Al).

Furthermore, in the eight example, the first electrodes $31_1$ and $31_2$ also serve as a light reflecting layer, and the optical constant (specifically, the phase shift amount) of the material constituting the first electrodes $31_1$ and $31_2$ varies depending on the light emitting units $30_1$ and $30_2$. For example, the first electrode $31_1$ of the light emitting unit $30_1$ may include copper (Cu), and the first electrode $31_2$ of the light emitting unit $30_2$ and the first electrode $31_3$ of the light emitting unit $30_3$ are only required to include aluminum (Al). In the eight example, for example, the seventh example is applied to the light emitting units $30_1$ and $30_2$, and the first example is applied to the light emitting unit $30_3$. The thicknesses of the first electrodes $31_1$, $31_2$, and $31_3$ may be different or the same.

Example 6

Figure 16:
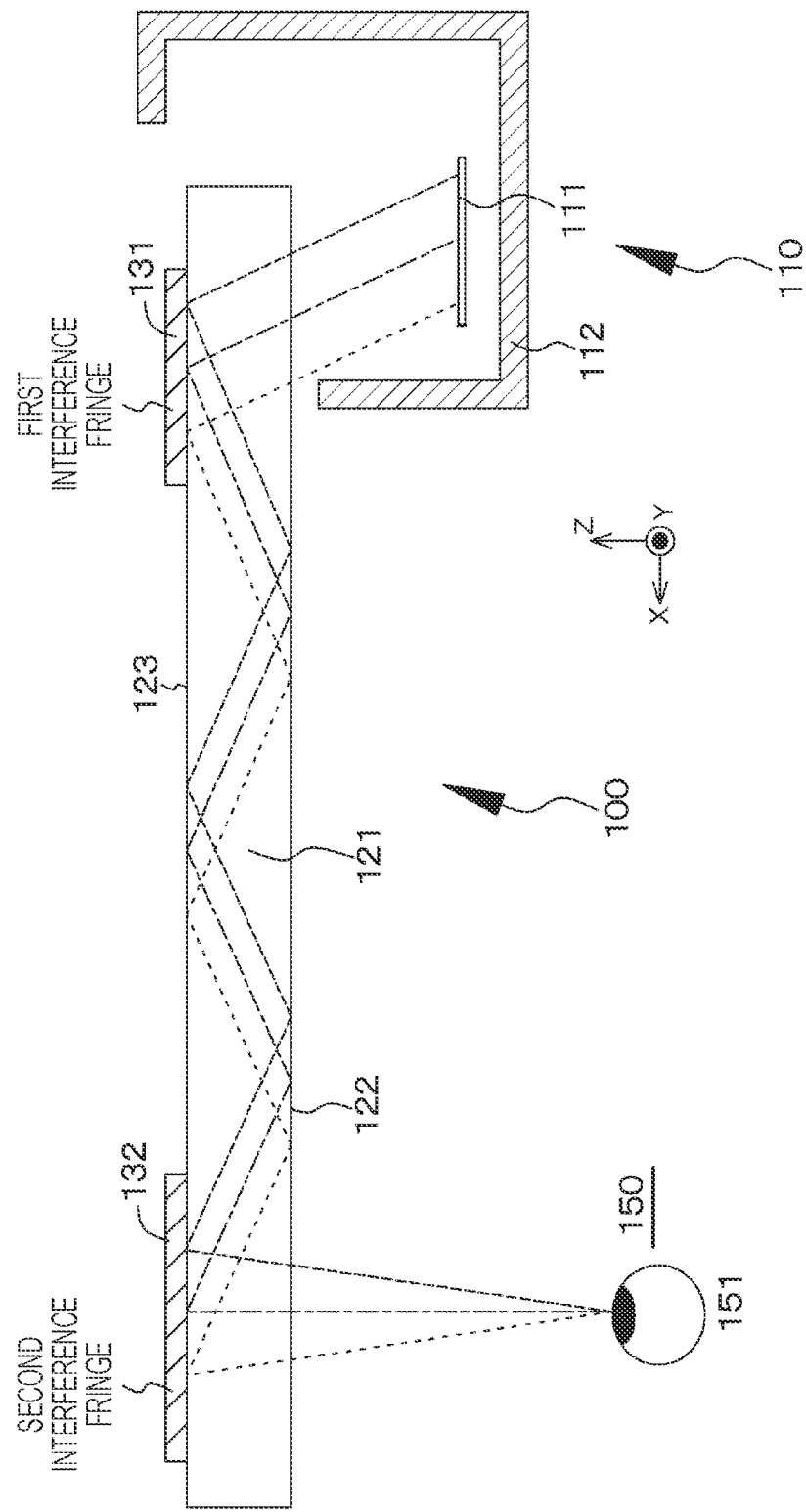
FIG. 16 is a conceptual diagram of an image display device constituting a head mounted display of Example 6.
Figure 17:
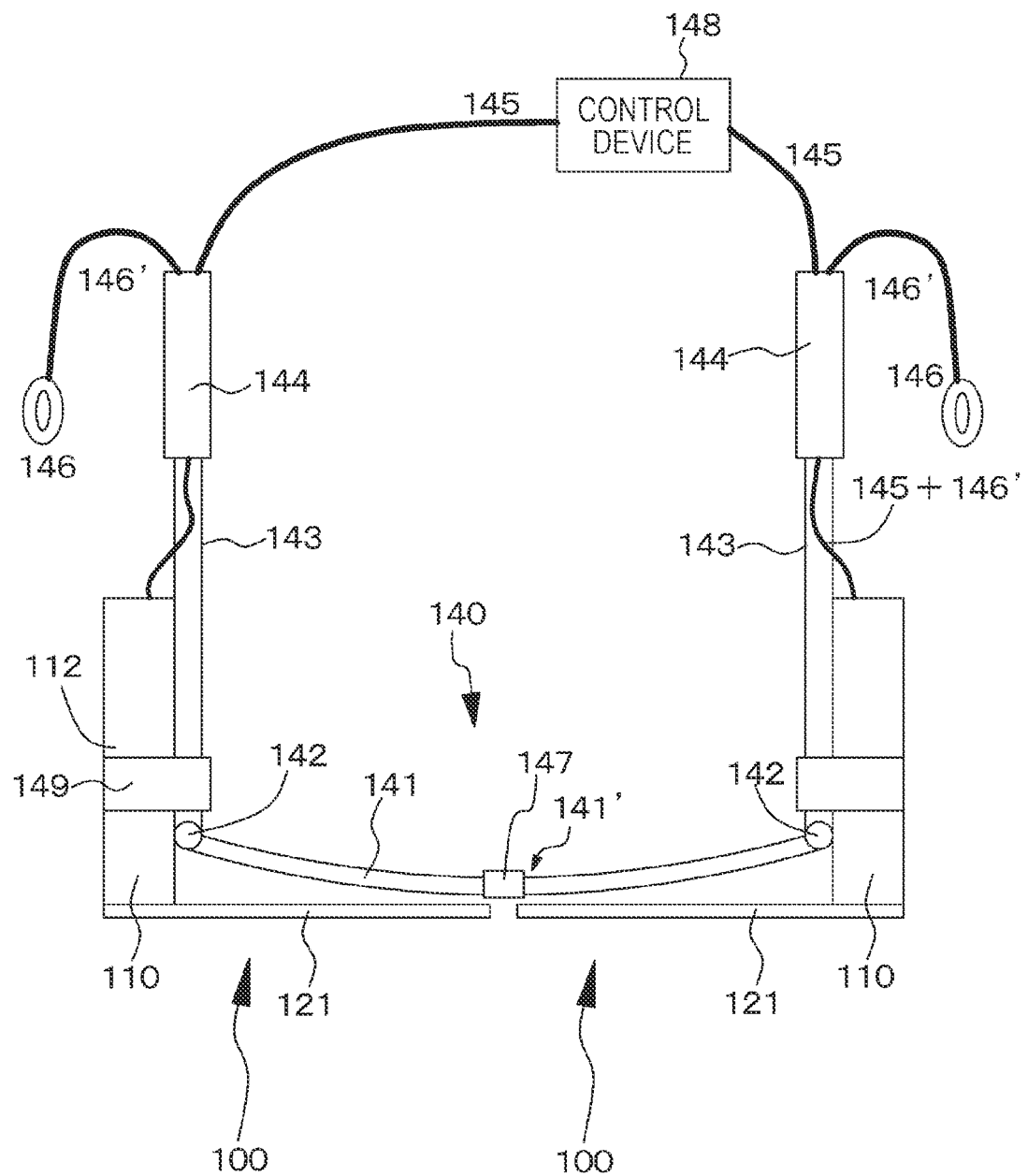
FIG. 17 is a schematic view of the head mounted display of Example 6 as viewed from above.
Figure 18:
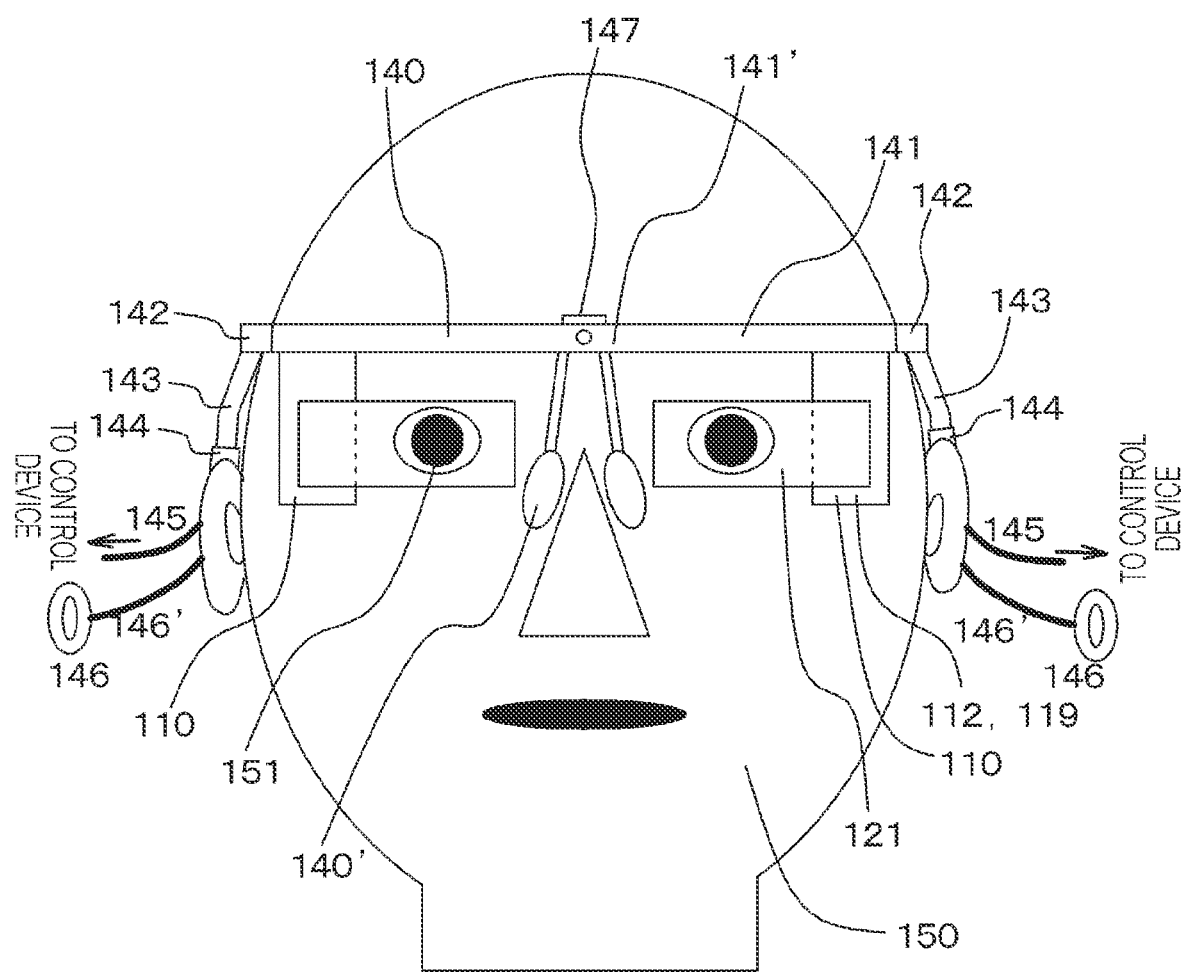
FIG. 18 is a schematic view of the head mounted display of Example 6 as viewed from the front.
Figure 19A:
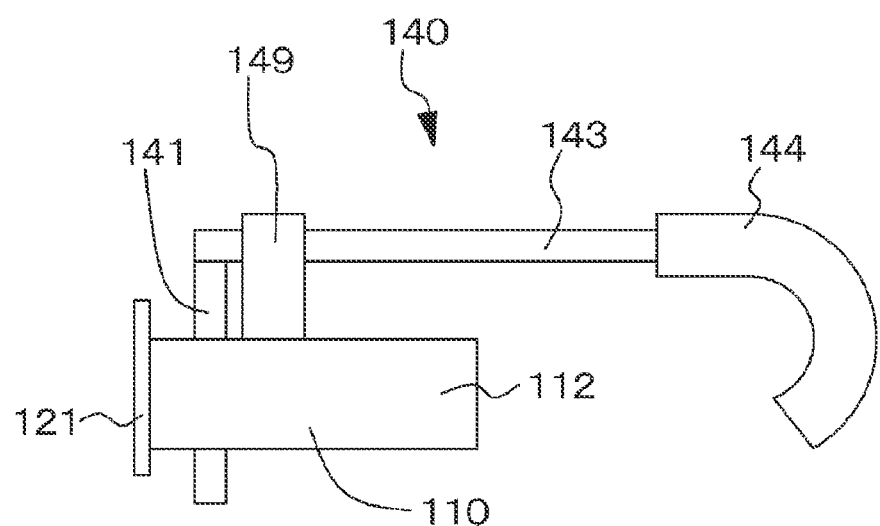
FIGS. 19A and 19B are a schematic view of the head mounted display of Example 6 as viewed from the side, and a schematic cross-sectional view illustrating a part of a reflective volume hologram diffraction grating in the head mounted display of Example 6 in an enlarged manner, respectively.
Figure 19B:
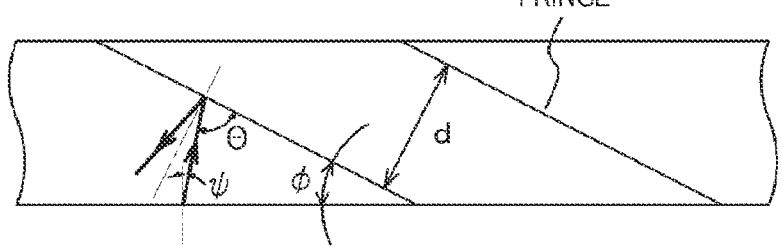

In Example 6, the display devices described in Examples 1 to 5 were applied to a head mounted display (HMD). A conceptual diagram of an image display device constituting the head mounted display of Example 6 is illustrated in FIG. 16, a schematic view of the head mounted display of Example 6 as viewed from above is illustrated in FIG. 17, a schematic view of the head mounted display of Example 6 as viewed from the front is illustrated in FIG. 18, and a schematic view of the head mounted display of Example 6 as viewed from the side is illustrated in FIG. 19A. Furthermore, a schematic partial cross-sectional view illustrating a part of the reflective volume hologram diffraction grating in the display device of Example 6 in an enlarged manner is illustrated in FIG. 19B.

An image display device 100 of Example 6 includes:

an image forming apparatus 110 including the display device 111 described in Example 1 to Example 4;

a light guide plate 121;

first deflection means 131 attached to the light guide plate 121; and second deflection means 132 attached to the light guide plate 121. Then, light from the image forming apparatus 110 is deflected (or reflected) by the first deflection means 131, propagated by total reflection through the inside of the light guide plate 121, deflected by the second deflection means 132, and emitted toward a pupil 151 of an observer 150.

The system including the light guide plate 121 and the second deflection means 132 is a semi-transmissive type (see-through type).

The head mounted display of Example 6 includes:

(A) a frame 140 (for example, a glasses-shaped frame 140) mounted on the head of the observer 150; and (B) the image display device 100 attached to the frame 140. Note that the head mounted display of Example 6 is specifically a binocular type including two image display devices, but may be a single eye type including one image display device. The image display device 100 may be fixedly attached to the frame 140, or may be detachably attached to the frame 140. The head mounted display is, for example, a direct drawing type head mounted display that directly draws an image on the pupil 151 of the observer 150.

The light guide plate 121 has a first surface 122 on which the light from the image forming apparatus 110 is incident and a second surface 123 facing the first surface 122. That is, the light guide plate 121 including optical glass or a plastic material has two parallel surfaces (the first surface 122 and the second surface 123) extending in parallel with a light propagation direction (X direction) due to total internal reflection of the light guide plate 121. The first surface 122 and the second surface 123 face each other. Then, the first deflection means 131 is disposed on (specifically, the first deflection means 131 is bonded to) the second surface 123 of the light guide plate 121, and the second deflection means 132 is disposed on (specifically, the second deflection means 132 is bonded to) the second surface 123 of the light guide plate 121.

The first deflection means (first diffraction grating member) 131 includes a hologram diffraction grating, specifically, a reflective volume hologram diffraction grating, and the second deflection means (second diffraction grating member) 132 also includes a hologram diffraction grating, specifically, a reflective volume hologram diffraction grating. A first interference fringe is formed inside the hologram diffraction grating constituting the first deflection means 131, and a second interference fringe is formed inside the hologram diffraction grating constituting the second deflection means 132.

The first deflection means 131 diffracts and reflects the parallel light incident on the light guide plate 121 from the second surface 123 such that the parallel light is totally reflected inside the light guide plate 121. The second deflection means 132 diffracts and reflects the light propagated by total reflection through the inside of the light guide plate 121, and guides the light to the pupil 151 of the observer 150. The second deflection means 132 forms a virtual image forming region in the light guide plate 121. The axes of the first deflection means 131 and the second deflection means 132 are parallel to the X-direction, and the normals of the first deflection means 131 and the second deflection means 132 are parallel to the Z-direction. In each reflective volume hologram diffraction grating including a photopolymer material, an interference fringe corresponding to one type of wavelength band (alternatively, the wavelength) is formed, and the reflective volume hologram diffraction grating is manufactured by a conventional method. The pitch of the interference fringes formed in the reflective volume hologram diffraction grating is constant, and the interference fringes are linear and parallel to the Y-direction.

FIG. 19B is an enlarged schematic partial cross-sectional view of the reflective volume hologram diffraction grating. In the reflective volume hologram diffraction grating, an interference fringe having an inclination angle (slant angle) φ is formed. Here, the inclination angle φ refers to an angle formed by the surface of the reflective volume hologram diffraction grating and the interference fringes. The interference fringes are formed from the inside to the surface of the reflective volume hologram diffraction grating. The interference fringes satisfy the Bragg condition. Here, the Bragg condition refers to a condition that satisfies the following Equation (A). In Equation (A), m represents a positive integer, λ represents a wavelength, d represents a pitch of a lattice plane (an interval in a normal direction of a virtual plane including an interference fringe), and Θ represents a complementary angle of an angle incident on the interference fringe. Furthermore, the relationship among Θ, the inclination angle φ, and the incident angle ψ in a case where light enters the diffraction grating member at the incident angle ψ is as shown in Equation (B).

$$m \cdot \lambda = 2 \cdot d \cdot \sin(\Theta) \tag{A}$$

$$\Theta = 90° - (\varphi + \psi) \tag{B}$$

In Example 6, the display device 111 constituting the image forming apparatus 110 includes the display devices of Examples 1 to 6. The entire image forming apparatus 110 is housed in a housing 112. Note that an optical system through which the image emitted from the display device 111 passes may be disposed in order to control a display dimension, a display position, and the like of the image emitted from the display device 111. The type of optical system to be arranged depends on specifications required for the head mounted display and the image forming apparatus 110. In a head mounted display or an image forming apparatus in which an image is sent from one display device 111 to both eyes, the display devices of Examples 1 to 5 are only required to be adopted.

The frame 140 includes a front portion 141 disposed in front of the observer 150, two temple portions 143 rotatably attached to both ends of the front portion 141 via hinges 142, and temple tip portions (also called a tip cell, an earmuff, and an ear pad) 144 attached to distal end portions of the respective temple portions 143. Furthermore, a nose pad 140' is attached. That is, the assembly of the frame 140 and the nose pad 140' basically has substantially the same structure as that of normal eyeglasses. Further, each housing 112 is attached to the temple portion 143 by a mounting member 149. The frame 140 includes metal or plastic. Note that each housing 112 may be detachably attached to the temple portion 143 by the mounting member 149. Furthermore, for an observer who owns and wears eyeglasses, each housing 112 may be detachably attached to the temple portion 143 of the frame 140 of the eyeglasses owned by the observer by the mounting member 149. Each housing 112 may be attached to the outside of the temple portion 143 or may be attached to the inside of the temple portion 143.

Alternatively, the light guide plate 121 may be fitted into a rim provided in the front portion 141.

Furthermore, wiring (a signal line, a power supply line, or the like) 145 extending from one of the image forming apparatuses 110 extends from the distal end portion of the temple tip portion 144 to the outside via the temple portion 143 and the inside of the temple tip portion 144, and is connected to a control device (a control circuit and control means) 148. Furthermore, each image forming apparatus 110 includes a headphone portion 146, and headphone portion wiring 146' extending from each image forming apparatus 110 extends from the distal end portion of the temple tip portion 144 to the headphone portion 146 via the temple portion 143 and the inside of the temple tip portion 144. More specifically, the headphone portion wiring 146' extends from the distal end portion of the temple tip portion 144 to the headphone portion 146 so as to go around the back side of the auricle (ear conch). With such a configuration, it is possible to obtain a clear head mounted display without giving an impression that the headphone portion 146 and the headphone portion wiring 146' are randomly positioned.

As described above, the wiring (a signal line, a power supply line, or the like) 145 is connected to the control device (control circuit) 148, and processing for image display is performed in the control device 148. The control device 148 can include a known circuit.

A camera 147 including a solid-state imaging element including a CCD or CMOS sensor and a lens (not illustrated) is attached to a central portion 141' of the front portion 141 by an appropriate attachment member (not illustrated) as necessary. A signal from the camera 147 is transmitted to the control device (control circuit) 148 via wiring (not illustrated) extending from the camera 147.

In the image display device of Example 6, light (for example, it corresponds to the size of one pixel or one sub-pixel) emitted from the display device 111 at a certain moment is parallel light. Then, this light reaches the pupil 151 (specifically, the crystalline lens) of the observer 150, and the light passing through the crystalline lens is finally imaged on the retina of the pupil 151 of the observer 150.

Although the present disclosure has been described above on the basis of preferred examples, the present disclosure is not limited to these examples. The configurations of the configurations and structures of the display device (organic EL display device) and the light emitting element (organic EL element) described in the examples are examples and can be appropriately changed, and the method for manufacturing the display device is also an example and can be appropriately changed.

In the examples, one pixel includes three sub-pixels from a combination of a white light emitting element and a color filter layer, but for example, one pixel may include four subpixels to which a light emitting element that emits white light is added. Alternatively, the light emitting element may be a red light emitting element in which the organic layer generates red, a green light emitting element in which the organic layer generates green, and a blue light emitting element in which the organic layer generates blue, and one pixel may be configured by combining these three types of light emitting elements (sub-pixels). In the examples, the light emitting element driving unit includes an MOSFET, but may include a TFT. The first electrode and the second electrode may have a single-layer structure or a multilayer structure.

Figure 20:
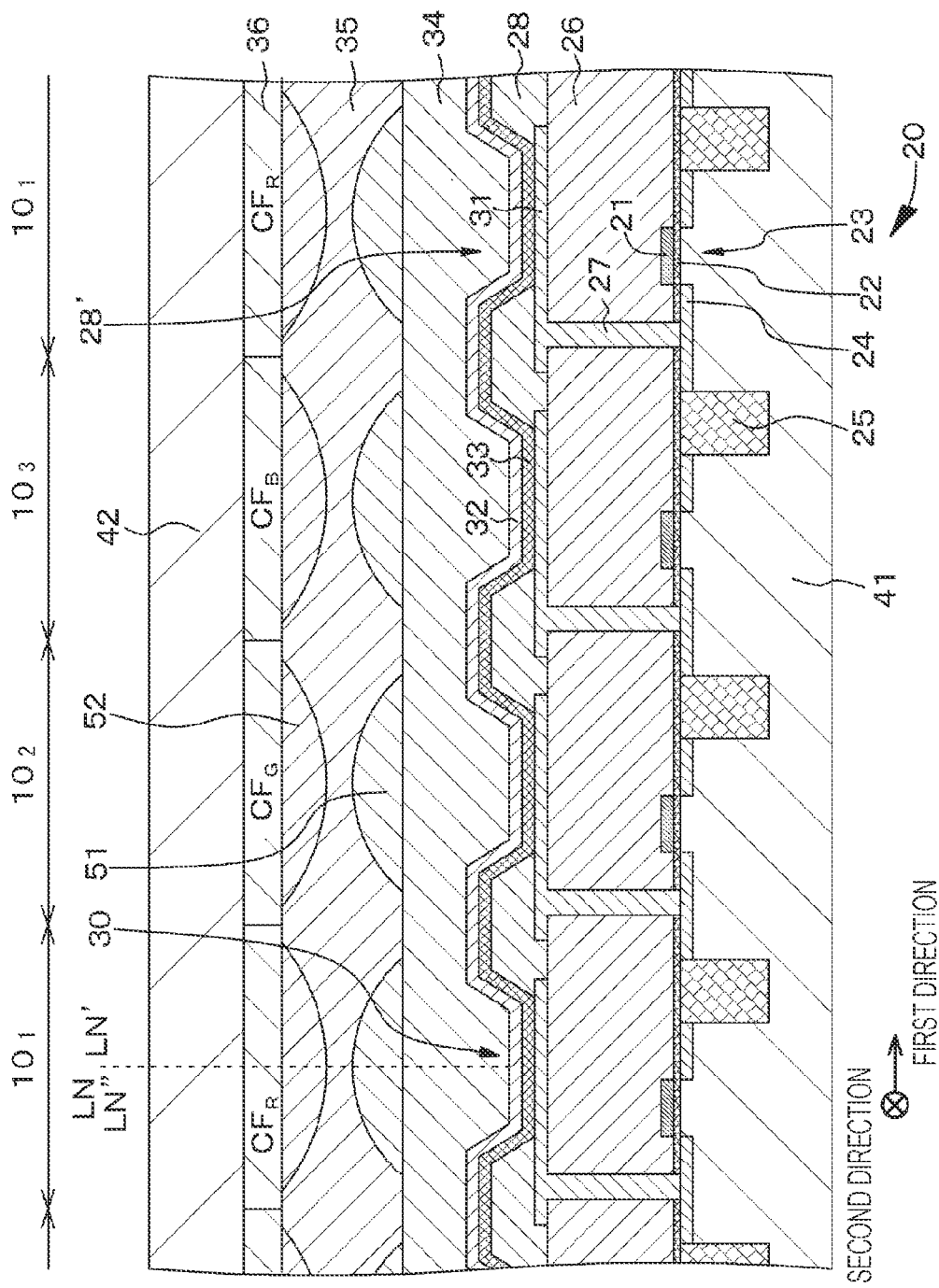
FIG. 20 is a schematic partial cross-sectional view of Modification Example-1 of the display device of Example 1.

As illustrated in a schematic partial cross-sectional view of the display device (including a schematic partial cross-sectional view of the light emitting element) in FIG. 20, wavelength selection means (color filter layer CF) may be provided between the second substrate 42 and the second microlens 52. Note that in the example illustrated in FIG. 20, the base layer 36 is not provided, but the base layer 36 may be provided. Furthermore, wavelength selection means (color filter layer CF) may be provided between the first microlens 51 and the second microlens 52.

Furthermore, in order to configure the divergent system, when the refractive index of a material constituting the first microlens 51 is defined as $n_1$, the refractive index of a material constituting the second microlens 52 is defined as $n_2$, and the refractive index of a material constituting the bonding member 35 is defined as $n_0$, the inequalities $n_1 < n_0$ and $n_2 < n_0$ may be satisfied.

Figure 21:
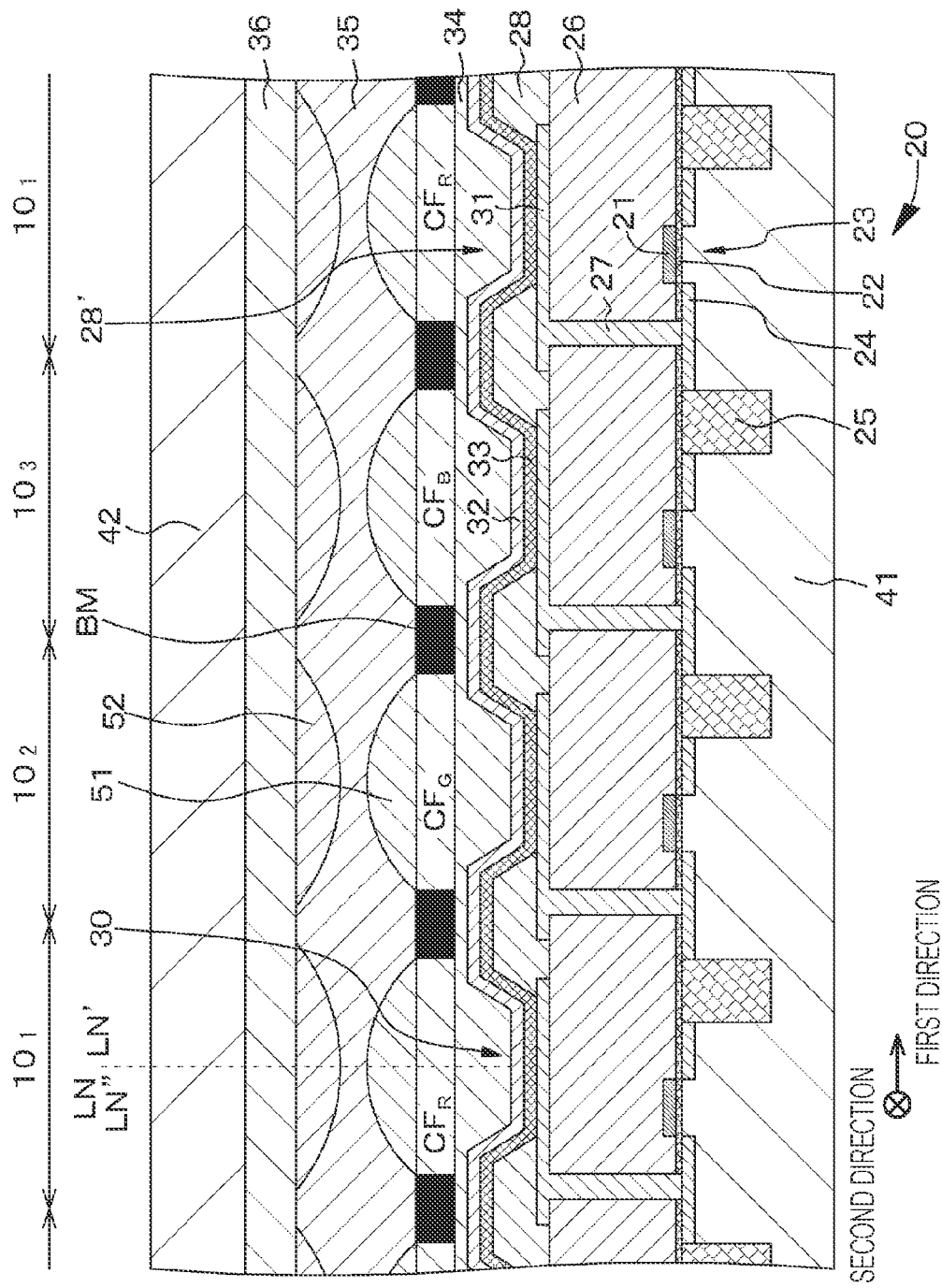
FIG. 21 is a schematic partial cross-sectional view of Modification Example-2 of the display device of Example 1.
Figure 22:
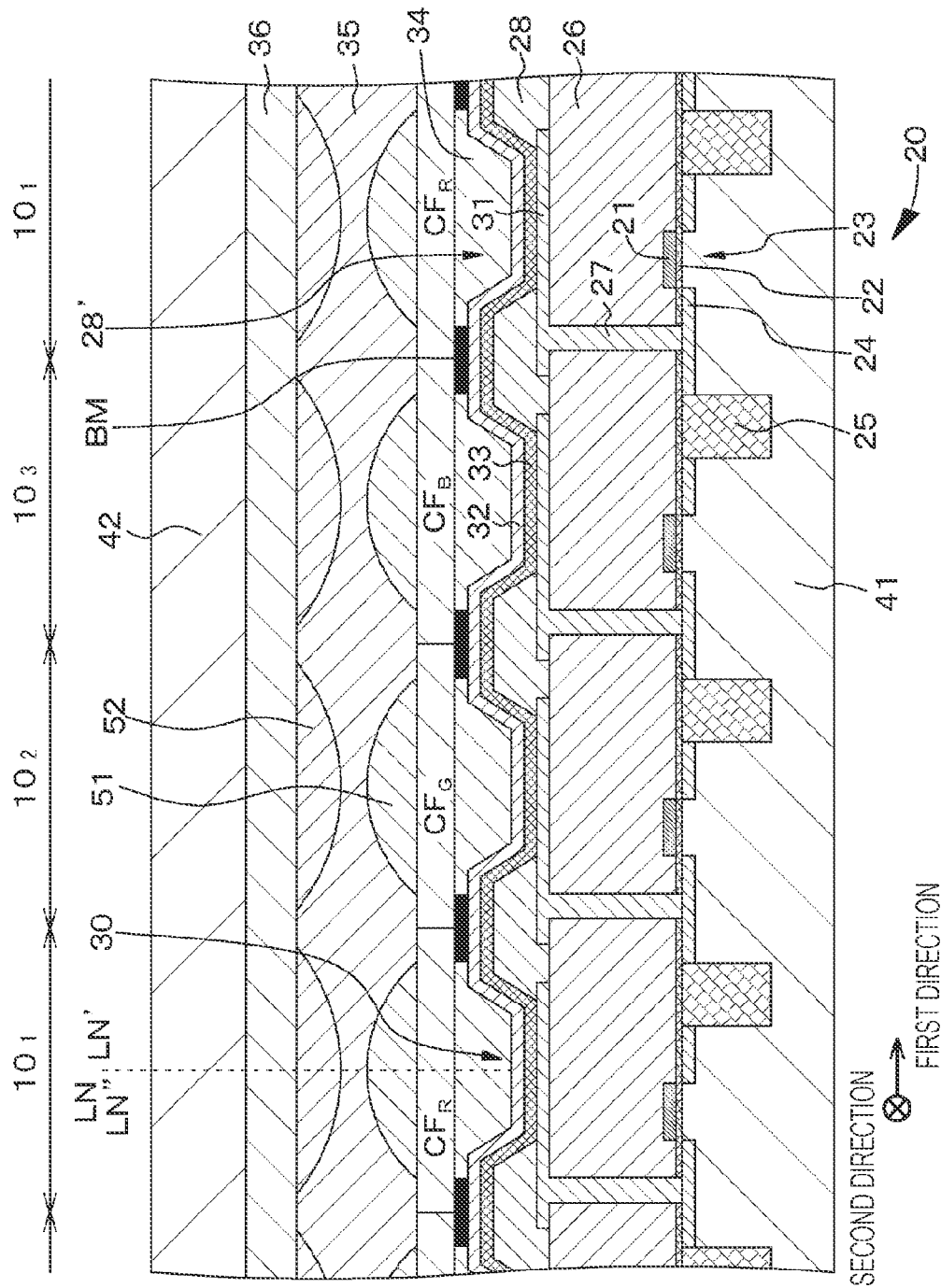
FIG. 22 is a schematic partial cross-sectional view of Modification Example-3 of the display device of Example 1.
Figure 23:
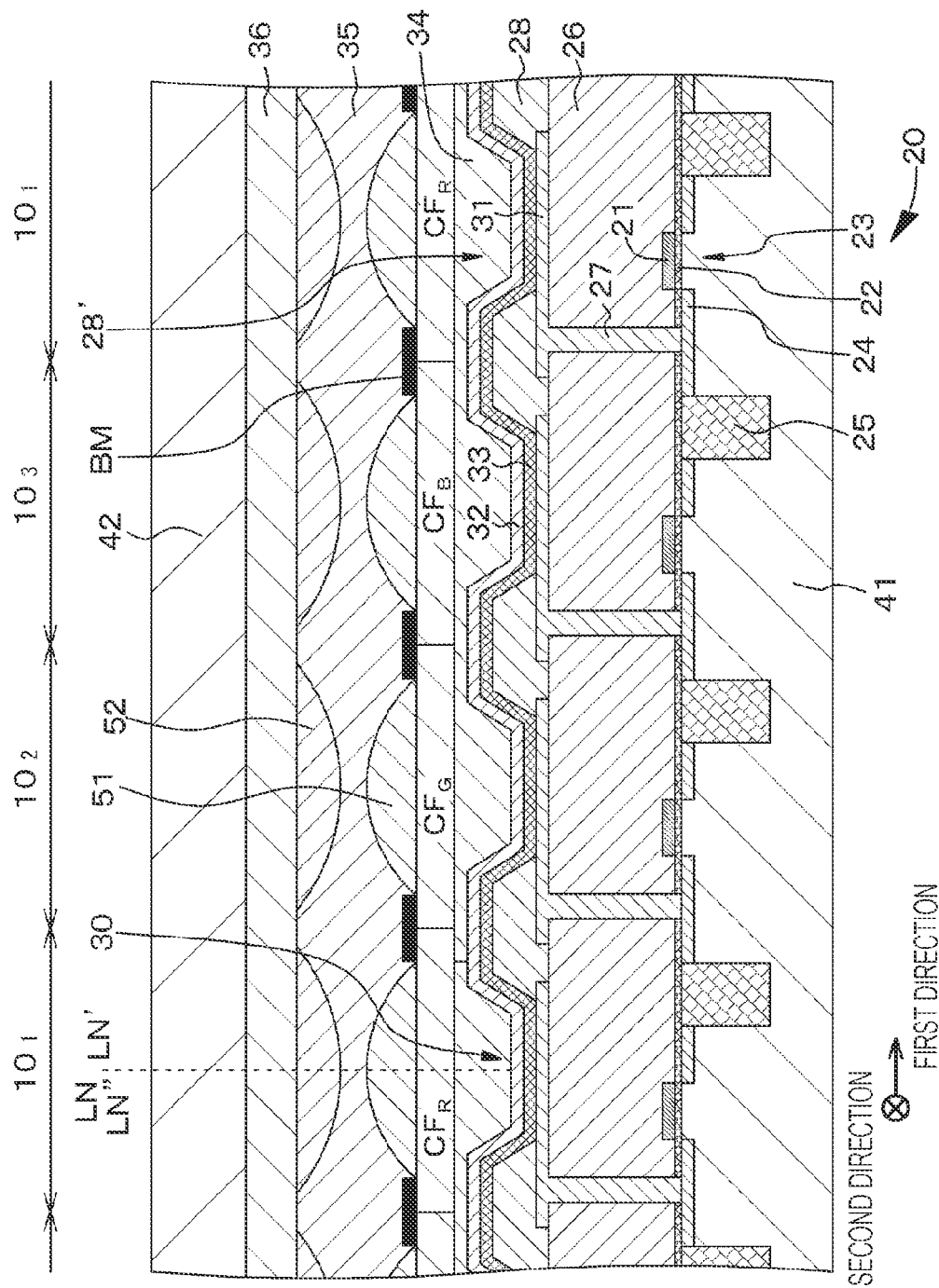
FIG. 23 is a schematic partial cross-sectional view of Modification Example-4 of the display device of Example 1.

As illustrated in a schematic partial cross-sectional view of the display device (including a schematic partial cross-sectional view of the light emitting element) in FIG. 21, a black matrix layer BM may be provided between the color filter layer CF and the color filter layer CF. Furthermore, as illustrated in a schematic partial cross-sectional view of the display device (including a schematic partial cross-sectional view of the light emitting element) in FIG. 22, the black matrix layer BM may be provided in the flattening layer 34 positioned below between the color filter layer CF and the color filter layer CF. Furthermore, as illustrated in a schematic partial cross-sectional view of the display device (including a schematic partial cross-sectional view of the light emitting element) in FIG. 23, the black matrix layer BM may be provided on the color filter layer CF positioned between the first microlens 51 and the first microlens 51. The black matrix layer BM includes, for example, a black resin film (specifically, for example, a black polyimide-based resin) mixed with a black colorant and having an optical density of 1 or more.

In order to prevent light emitted from a certain light emitting element from entering a light emitting element adjacent to the certain light emitting element and occurrence of optical crosstalk, a light shielding layer may be provided between the light emitting element and the light emitting element. That is, a groove portion may be formed between the light emitting element and the light emitting element, and the groove portion may be filled with a light shielding material to form the light shielding layer. When the light shielding layer is provided in this manner, it is possible to reduce a ratio at which light emitted from a certain light emitting element enters an adjacent light emitting element, and it is possible to suppress occurrence of a phenomenon in which color mixing occurs and chromaticity of the entire pixel deviates from desired chromaticity. Then, since color mixing can be prevented, the color purity when the pixel emits light in a single color is increased, and the chromaticity point is deepened. Therefore, the color gamut is widened, and the range of color representation of the display device is widened. Specific examples of the light shielding material constituting the light shielding layer include materials capable of shielding light such as titanium (Ti), chromium (Cr), tungsten (W), tantalum (Ta), aluminum (Al), and $MoSi_2$. The light shielding layer can be formed by a vapor deposition method including an electron beam vapor deposition method, a hot filament vapor deposition method, and a vacuum vapor deposition method, a sputtering method, a CVD method, an ion plating method, or the like. Furthermore, although the color filter layer is disposed for each pixel in order to improve the color purity, the color filter layer can be thinned or the color filter layer can be omitted depending on the configuration of the light emitting element, and the light absorbed in the color filter layer can be extracted, resulting in improvement of the light emission efficiency. Alternatively, a light shielding property may be imparted to the black matrix layer BM.

Figure 27A:
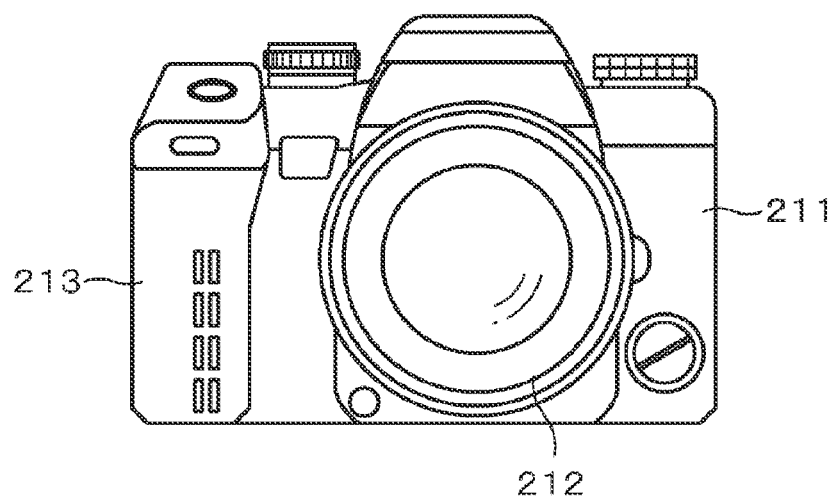
FIGS. 27A and 27B illustrate an example in which the display device of the present disclosure is applied to a lens interchangeable single lens reflex type digital still camera, and a front view and a rear view of the digital still camera are illustrated in FIG. 27A and FIG. 27B, respectively.
Figure 27B:
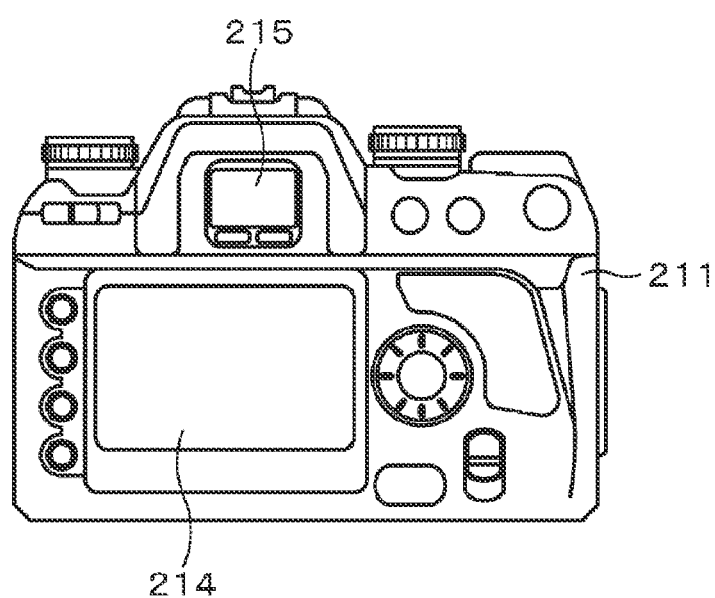

The display device of the present disclosure can be applied to a lens interchangeable single lens reflex type digital still camera. A front view of the digital still camera is illustrated in FIG. 27A, and a rear view thereof is illustrated in FIG. 27B. This lens interchangeable single lens reflex type digital still camera includes, for example, an interchangeable imaging lens unit (interchangeable lens) 212 on the front right side of a camera main body portion (camera body) 211, and a grip portion 213 to be held by a photographer on the front left side. Then, a monitor 214 is provided substantially at the center of the back surface of the camera main body portion 211. An electronic view finder (eyepiece window) 215 is provided above the monitor 214. When a photographer looks into the electronic view finder 215, the photographer can determine the composition by visually recognizing the image of a subject guided from the imaging lens unit 212. In the lens interchangeable single lens reflex type digital still camera having such a configuration, the display device of the present disclosure can be used as the electronic view finder 215.

Figure 28:
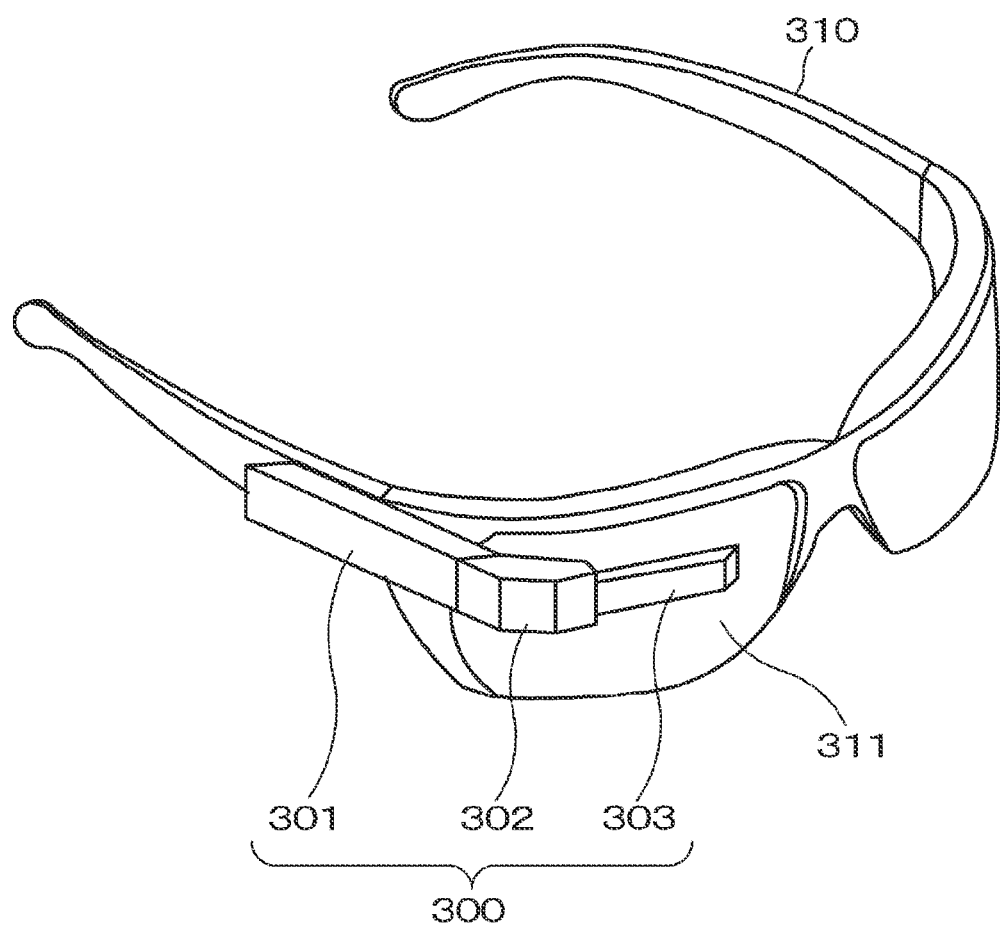
FIG. 28 is an external view of the head mounted display illustrating an example in which the display device of the present disclosure is applied to a head mounted display.

Alternatively, the display device of the present disclosure can be applied to the head mounted display. As illustrated in an external view in FIG. 28, a head mounted display 300 includes a transmissive head mounted display including a main body 301, an arm portion 302, and a lens barrel 303. The main body 301 is connected to the arm portion 302 and eyeglasses 310. Specifically, an end portion of the main body 301 in the long side direction is attached to the arm portion 302. Furthermore, one side of the side surface of the main body 301 is connected to the eyeglasses 310 via a connection member (not illustrated). Note that the main body 301 may be directly mounted on the head of a human body. The main body 301 incorporates a control board and a display unit for controlling the operation of the head mounted display 300. The arm portion 302 supports the lens barrel 303 with respect to the main body 301 by connecting the main body 301 and the lens barrel 303. Specifically, the arm portion 302 is coupled to the end portion of the main body 301 and the end portion of the lens barrel 303 to fix the lens barrel 303 to the main body 301. Furthermore, the arm portion 302 incorporates a signal line for communicating data related to an image provided from the main body 301 to the lens barrel 303. The lens barrel 303 projects image light provided from the main body 301 via the arm portion 302 toward the eyes of a user wearing the head mounted display 300 through the lens 311 of the eyeglasses 310. In the head mounted display 300 having the configuration described above, the display device of the present disclosure can be used as the display unit built in the main body 301.

Note that the present disclosure can also have the following configurations.

[A01] Light Emitting Element . . . First Aspect>>
A light emitting element including:
a first substrate and a second substrate;
a light emitting unit provided above the first substrate;
a first microlens formed above the light emitting unit and having a convex shape toward the second substrate;
a second microlens provided on the second substrate and having a convex shape toward the first microlens; and
a bonding member interposed between the first microlens and the second microlenses.

[A02] The light emitting element according to [A01], in which a top portion of the first microlens and a top portion of the second microlens are in contact with each other.

[A03] The light emitting element according to [A02], in which a flat portion is formed by the top portion where the first microlens and the second microlens are in contact with each other.

[A04] The light emitting element according to [A03], in which when an area of the flat portion where the first microlens and the second microlens are in contact with each other is defined as $S_{12}$, and an area of a light emitting region of the light emitting unit is defined as $S_0$, the following inequality is satisfied:

$$0.5 \leq S_0/S_{12} \leq 1.2.$$

[A05] The light emitting element according to [A03] or [A04], in which when a curvature radius of a portion of the first microlens excluding the flat portion is defined as $r_1$, and a curvature radius of a portion of the second microlens excluding the flat portion is defined as $r_2$, the following inequality is satisfied:

$$r_2/r_1 > 1.$$

[A06] The light emitting element according to any one of [A01] to [A05], in which an emission angle $\theta_{out}$ of light emitted from a central portion of the light emitting region of the light emitting unit, the light being emitted from a portion of the first microlens excluding the flat portion, passing through the bonding member, entering a portion of the second microlens excluding the flat portion, and being emitted from the second substrate with respect to the second substrate, is 10 degrees or less.

[A07] The light emitting element according to any one of [A01] to [A06], in which when a refractive index of a material constituting the first microlens is defined as $n_1$, a refractive index of a material constituting the second microlens is defined as $n_2$, and a refractive index of a material constituting the bonding member is defined as $n_0$, the following inequalities are satisfied:

$$n_1 > n_0$$

and $$n_2 > n_0.$$

[A08] The light emitting element according to [A07], in which the following inequality is satisfied:

$$n_1 = n_2 > n_0.$$

[A09] The light emitting element according to any one of [A01] to [A06], in which when a refractive index of a material constituting the first microlens is defined as $n_1$, a refractive index of a material constituting the second microlens is defined as $n_2$, and a refractive index of a material constituting the bonding member is defined as $n_0$, the following inequalities are satisfied:

$$n_1 < n_0$$

and $$n_2 < n_0.$$

[A10] The light emitting element according to any one of [A01] to [A09], in which the light emitting unit has a convex-shaped cross-sectional shape toward the first substrate.

[A11] The light emitting element according to any one of [A01] to [A10], further including wavelength selection means between the light emitting unit and the first microlens.

[A12] The light emitting element according to any one of [A01] to [A10], further including wavelength selection means between the second substrate and the second microlens.

[A13] Display Device>>
A display device including:
a first substrate and a second substrate; and
a plurality of light emitting element units each including a first light emitting element, a second light emitting element, and a third light emitting element provided on the first substrate,
in which each light emitting element includes a light emitting unit provided above the first substrate,
a first microlens formed above the light emitting unit and having a convex shape toward the second substrate,
a second microlens provided on the second substrate and having a convex shape toward the first microlens, and
a bonding member interposed between the first microlens and the second microlens.

[A14] The display device according to [A13], in which
each light emitting element has a resonator structure,
the first light emitting element emits red light, the second light emitting element emits green light, and the third light emitting element emits blue light,
the first light emitting element is provided with wavelength selection means that allows the emitted red light to pass therethrough, and
the second light emitting element and the third light emitting element are not provided with the wavelength selection means.

[A15]<<Method for Manufacturing Display Device>>
A method for manufacturing a display device, the method including each step of:
preparing a first substrate above which a plurality of light emitting units and a plurality of first microlenses formed above the light emitting units and having a convex shape in a direction away from the first substrate are provided;
preparing a second substrate including a second microlens having a convex shape in a direction away from the second substrate;
forming a bonding member on a surface of the first substrate on which the first microlens is provided, a surface of the second substrate on which the second microlens is provided, or a surface of the first substrate on which the first microlens is provided and a surface of the second substrate on which the second microlens is provided;
disposing the first substrate and the second substrate such that the first microlens and the second microlens face each other with the bonding member interposed therebetween;
forming a flat portion by bringing a top surface of the first microlens into contact with a top surface of the second microlens by applying pressure to the first substrate and the second substrate; and thereafter
bonding the first microlens and the second microlens by the bonding member after aligning the first substrate and the second substrate.

REFERENCE SIGNS LIST

10, $10_1$, $10_2$, $10_3$ Light emitting element
20 Transistor
21 Gate electrode
22 Gate insulating layer
23 Channel formation region
24 Source/drain region
25 Element isolation region
26 Base substrate
26A Surface of base substrate
27 Contact plug
28 Insulating layer
28' Opening section
29 Concave portion
29A Inclined surface of concave portion
29B Bottom of concave portion
30, $30_1$, $30_2$, $30_3$, 30' Light emitting unit
31, $31_1$, $31_2$, $31_3$ First electrode
32, $32_1$, $32_2$, $32_3$ Second electrode
33, $33_1$, $33_2$, $33_3$ Organic layer
34 Protective layer (flattening layer)
34' Protective film
35 Bonding member
36 Base layer
37, $37_1$, $37_2$, $37_3$ Light reflecting layer
$38_1$, $38_2$, $38_3$, 38', $38_1'$, $38_2'$, $38_3'$ Interlayer insulating layer
39 Base film
$CF_R$, $CF_G$, $CF_B$ Color filter layer (wavelength selection means)
TF Transparent filter layer
BM Black matrix layer
41 First substrate
42 Second substrate
51 First microlens
51A Part of first microlens (peripheral portion)
52 Second microlens
52A Part of second microlens (peripheral portion)
53 Flat portion
61 Mask layer
62, 63, 64 Resist layer
65 Opening section
LN Center of light emitting region
LN' Optical axis of first microlens
LN" Optical axis of second microlens
100 Image display device
110 Image forming apparatus
111 Display device
112 Housing
121 Light guide plate
122 First surface of light guide plate
123 Second surface of light guide plate
131 First deflection means
132 Second deflection means
140 Frame
140' Nose pad
141 Front portion
141' Central portion of front portion
142 Hinge
143 Temple portion
144 Temple tip portion (tip cell, earmuff, ear pad)
145 Wiring (signal line, power supply line, or the like)
146 Headphone unit
146' Wiring for headphone portion
147 Camera
148 Control device (control circuit, control means)
149 Mounting member
150 Observer
151 Pupil
211 Camera main body portion (camera body)
212 Imaging lens unit (interchangeable lens)
213 Grip portion
214 Monitor 215 Electronic view finder (eyepiece window)
300 Head mounted display
301 Main body
302 Arm portion
303 Lens barrel
310 Eyeglasses

The invention claimed is:

1. A light emitting element comprising:
a first substrate and a second substrate;
a light emitting unit provided above the first substrate;
a first microlens formed above the light emitting unit and having a convex shape toward the second substrate;
a second microlens provided on the second substrate and having a convex shape toward the first microlens; and
a bonding member interposed between the first microlens and the second microlens,
wherein a top portion of the first microlens and a top portion of the second microlens are in contact with each other.

2. The light emitting element according to claim 1, wherein a flat portion is formed by the top portion where the first microlens and the second microlens are in contact with each other.

3. The light emitting element according to claim 2, wherein when an area of the flat portion where the first microlens and the second microlens are in contact with each other is defined as S12, and an area of a light emitting region of the light emitting unit is defined as S0, the following inequality is satisfied:

$0.5 \leq S0/S12 \leq 1.2$.

4. The light emitting element according to claim 2, wherein when a curvature radius of a portion of the first microlens excluding the flat portion is defined as r1, and a curvature radius of a portion of the second microlens excluding the flat portion is defined as r2, the following inequality is satisfied:

$r2/r1 > 1$.

5. The light emitting element according to claim 2, wherein an emission angle θ out of light emitted from a central portion of the light emitting region of the light emitting unit, the light being emitted from a portion of the first microlens excluding the flat portion, passing through the bonding member, entering a portion of the second microlens excluding the flat portion, and being emitted from the second substrate with respect to the second substrate, is 10 degrees or less.

6. The light emitting element according to claim 1, wherein when a refractive index of a material constituting the first microlens is defined as n1, a refractive index of a material constituting the second microlens is defined as n2, and a refractive index of a material constituting the bonding member is defined as n0, the following inequalities are satisfied:

$n1 > n0$ and $n2 > n0$.

7. The light emitting element according to claim 6, wherein the following equation is satisfied:

$n1 = n2 > n0$.

8. The light emitting element according to claim 1, wherein when a refractive index of a material constituting the first microlens is defined as n1, a refractive index of a material constituting the second microlens is defined as n2, and a refractive index of a material constituting the bonding member is defined as n0, the following inequalities are satisfied:

$n1 < n0$ and $n2 < n0$.

9. The light emitting element according to claim 1, wherein the light emitting unit has a convex-shaped cross-sectional shape toward the first substrate.

10. The light emitting element according to claim 1, further comprising wavelength selection means between the light emitting unit and the first microlens.

11. The light emitting element according to claim 1, further comprising wavelength selection means between the second substrate and the second microlens.

12. A display device comprising:
a first substrate and a second substrate; and
a plurality of light emitting element units each including a first light emitting element, a second light emitting element, and a third light emitting element provided on the first substrate,
wherein each light emitting element includes a light emitting unit provided above the first substrate,
a first microlens formed above the light emitting unit and having a convex shape toward the second substrate,
a second microlens provided on the second substrate and having a convex shape toward the first microlens, and
a bonding member interposed between the first microlens and the second microlens,
wherein a top portion of the first microlens and a top portion of the second microlens are in contact with each other.

13. The display device according to claim 12, wherein each light emitting element has a resonator structure,
the first light emitting element emits red light, the second light emitting element emits green light, and the third light emitting element emits blue light,
the first light emitting element is provided with wavelength selection means that allows the emitted red light to pass therethrough, and
the second light emitting element and the third light emitting element are not provided with the wavelength selection means.

14. A method for manufacturing a display device, the method comprising each step of:
preparing a first substrate above which a light emitting unit and a first microlenses formed above the light emitting unit and having a convex shape in a direction away from the first substrate are provided;
preparing a second substrate including a second microlens having a convex shape in a direction away from the second substrate;
forming a bonding member on a surface of the first substrate on which the first microlens is provided, a surface of the second substrate on which the second microlens is provided, or a surface of the first substrate on which the first microlens is provided and a surface of the second substrate on which the second microlens is provided;
disposing the first substrate and the second substrate such that the first microlens and the second microlens face each other with the bonding member interposed therebetween;

forming a flat portion by bringing a top surface of the first microlens into contact with a top surface of the second microlens by applying pressure to the first substrate and the second substrate; and bonding the first microlens and the second microlens by the bonding member after aligning the first substrate and the second substrate.

\* \* \* \* \*